(12) United States Patent
Medure et al.

(10) Patent No.: US 12,523,380 B2
(45) Date of Patent: Jan. 13, 2026

(54) PREVENTION OF CONTAMINATION OF SUBSTRATES DURING PRESSURE CHANGES IN PROCESSING SYSTEMS

(71) Applicant: Applied Materials, Inc., Santa Clara, CA (US)

(72) Inventors: Robert A. Medure, Santa Clara, CA (US); Raechel Chu-Hui Tan, San Francisco, CA (US); Changgong Wang, San Jose, CA (US); Yuanhong Guo, Mountain View, CA (US); Sai Padhy, San Jose, CA (US); Ashley M. Okada, San Jose, CA (US); Kenneth Le, Fremont, CA (US); Atilla Kilicarslan, Mountain View, CA (US); Dean C. Hruzek, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 562 days.

(21) Appl. No.: 17/886,748

(22) Filed: Aug. 12, 2022

(65) Prior Publication Data

US 2023/0048337 A1  Feb. 16, 2023

Related U.S. Application Data

(60) Provisional application No. 63/260,301, filed on Aug. 16, 2021.

(51) Int. Cl.
*F24F 3/167* (2021.01)
*F24F 11/00* (2018.01)
(Continued)

(52) U.S. Cl.
CPC .......... *F24F 3/167* (2021.01); *F24F 11/0001* (2013.01); *F24F 11/49* (2018.01); *F24F 11/74* (2018.01); *F24F 2110/40* (2018.01)

(58) Field of Classification Search
CPC .. F24F 3/167; F24F 11/74; F24F 11/49; F24F 11/0001; F24F 2110/40
(Continued)

(56) References Cited

U.S. PATENT DOCUMENTS 7,508,518 B2 * 3/2009 Tamura .................. G01N 15/06
356/432
8,880,210 B2 * 11/2014 Porthouse .......... G05D 16/2046
700/104
(Continued)

FOREIGN PATENT DOCUMENTS

JP H05190642 A 7/1993
JP H09148265 A 6/1997
(Continued)

OTHER PUBLICATIONS

PCT International Search Report and Written Opinion for International Application No. PCT/US2022/040374, mailed Dec. 1, 2022, 11 pages.
(Continued)

*Primary Examiner* — Avinash A Savani
*Assistant Examiner* — Dana K Tighe
(74) *Attorney, Agent, or Firm* — Lowenstein Sandler LLP

(57) ABSTRACT

Disclosed are implementations for minimizing substrate contamination during pressure changes in substrate processing systems. Over a duration of a pressure change (increase or decrease) in a chamber of a substrate processing system, a flow rate is adjusted multiple times to reduce occurrence of contaminant particles in an environment of the chamber. In some instances, the flow rate is changed continuously using at least one dynamic valve that enable continuous control over the pressure dynamics of the chamber.

23 Claims, 12 Drawing Sheets

(51) Int. Cl.
*F24F 11/49* (2018.01)
*F24F 11/74* (2018.01)
*F24F 110/40* (2018.01)

(58) Field of Classification Search
USPC ........................................................ 454/187
See application file for complete search history.

(56) References Cited

U.S. PATENT DOCUMENTS

| | | | |
|---|---|---|---|
| 10,796,935 B2 * | 10/2020 | Wyatt | ............... H01L 21/67109 |
| 2002/0104206 A1 | 8/2002 | Hirano | |
| 2004/0262254 A1 | 12/2004 | Ozawa et al. | |
| 2007/0006936 A1 | 1/2007 | Hosokawa et al. | |
| 2008/0176412 A1 * | 7/2008 | Komeda | ............. C23C 16/4412 |
| | | | 118/712 |
| 2011/0094596 A1 | 4/2011 | Sugiyama et al. | |
| 2018/0172491 A1 * | 6/2018 | Ding | ........................ G01F 1/34 |
| 2020/0081459 A1 * | 3/2020 | L'Bassi | ............. C23C 16/45557 |
| 2020/0219744 A1 | 7/2020 | Kim et al. | |

FOREIGN PATENT DOCUMENTS

| | | |
|---|---|---|
| JP | H09222344 A | 8/1997 |
| JP | H09306972 A | 11/1997 |
| JP | H1040549 A | 2/1998 |
| JP | 2007035874 A | 2/2007 |
| JP | 4916140 B2 * | 4/2012 |
| JP | 2017-022215 A | 1/2017 |
| KR | 10-2004-0035342 A | 4/2004 |
| TW | 202129793 A | 8/2021 |

OTHER PUBLICATIONS

Zhao et al., "The Formation of Water Aerosols During Pump-Down of Vacuum Process Tools," Solid State Technology, Sep. 1990, pp. 85-89.

Extended European Search Report for European Application No. 22859009.7 mailed Jul. 1, 2025, 08 Pages.

* cited by examiner

PREVENTION OF CONTAMINATION OF SUBSTRATES DURING PRESSURE CHANGES IN PROCESSING SYSTEMS

RELATED APPLICATIONS

The instant application claims the benefit of U.S. Provisional Patent Application No. 63/260,301, filed Aug. 16, 2021, which is hereby incorporated herein by reference.

TECHNICAL FIELD

This instant specification generally relates to improving quality of substrates (e.g., wafers) in electronic device manufacturing systems, and, more specifically, to methods of minimizing presence of contaminants in an environment of a substrate processing apparatus.

BACKGROUND

Manufacturing of modern materials often involves various etching and deposition techniques, including plasma etching, chemical and physical vapor deposition (PVD) techniques, in which atoms of one or more selected types are deposited on a specially prepared substrate that is held in low or high vacuum environments provided by vacuum deposition chambers. Materials manufactured using this technology include monocrystals, semiconductor films, fine coatings, and numerous other substances used in practical applications, such as electronic device manufacturing. Many of these applications require certain standards of purity of the materials grown in the deposition chambers. The need to maintain isolation of the inter-chamber environment and to minimize its exposure to ambient atmosphere and contaminants therein gives rise to various robotic techniques of substrate manipulation and chamber control. Automatic operations often involve robots transferring substrates between chambers that have very different environments.

BRIEF DESCRIPTION OF THE DRAWINGS

Aspects and implementations of the present disclosure will be understood more fully from the detailed description given below and from the accompanying drawings, which, however, should not be taken to limit the disclosure to the specific aspects or implementations, but are for explanation and understanding only. The drawings, described below, are for illustrative purposes and are not necessarily drawn to scale.

DETAILED DESCRIPTION

Figure 1:
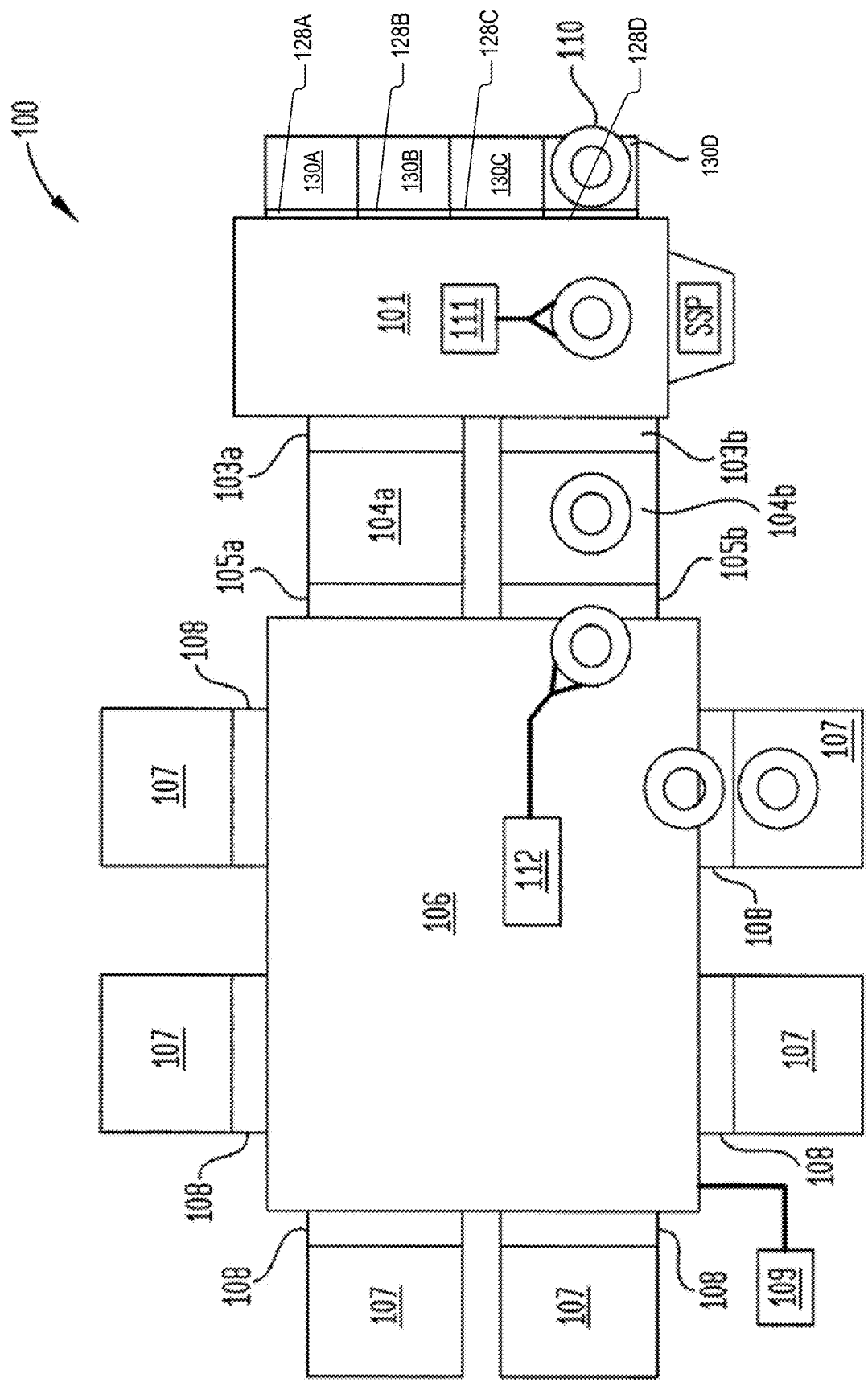
FIG. 1 illustrates a schematic view of a processing system (e.g., a substrate processing system), in accordance with some implementations of the present disclosure.

In a substrate processing system, a substrate (e.g., a silicon wafer) can undergo a number of processing stages. For example, an unprocessed substrate can be delivered to the processing system in a substrate carrier, e.g., a front opening unified pod (FOUP). The FOUP can be docked to a factory interface (front end module). A robotic arm of a factory interface robot can retrieve the substrate from the FOUP and deliver the substrate to a load-lock (degassing chamber). Another robotic arm can then be extended from a transfer chamber, retrieve the substrate from the load-lock chamber, and deliver the substrate for processing to one or more processing chambers accessible from the transfer chamber. Multiple processing chambers can be provided. The substrate can be moved (e.g., by the transfer chamber robot) between various processing chambers in which different stage of processing can be performed, e.g., mask deposition, etching, mask removal, substance deposition, and so on. After processing, the substrate can be returned back to the (same or a different) FOUP, e.g., through the transfer chamber, the load-lock chamber, the factory interface, and the like. Each chamber can have a specific environment, e.g., temperature, pressure, type of gas, etc. For example, the transfer chamber (and the processing chambers) can have a low-vacuum or high vacuum environment with pressure $P_T$ that is much less than the atmospheric pressure. On the other hand, the factory interface (and the FOUPs) can have pressure $P_f$ that is close to the atmospheric pressure. Accordingly, the load-lock chamber (degassing chamber, or some other chamber) can serve as an airlock between the factory interface and the transfer chamber. Specifically, when the substrate is to be transferred from the factory interface to the load-lock chamber (and then to the transfer chamber), the pressure in the load-lock chamber can be gradually lowered from $P_I$ to the pressure $P_T$ in the transfer chamber. Such a pump-down process, if performed quickly, can result in the lowering of temperature in the load-lock chamber and a condensation of various vapors (e.g., water vapor) on the substrate. The condensate, subsequently carried by the substrate into the transfer chamber and the processing chambers, can detrimentally affect the manufacturing process and the quality of the end product (e.g., by preventing the deposed material from adhering properly to the substrate). On the other hand, the pump-down process, if performed slowly, reduces the manufacturing output (throughput) of the system. Similarly, when the substrate is transferred from the transfer chamber to the load-lock chamber (and then to the factory interface), the pressure in the load-lock chamber is gradually increased from $P_T$ to the pressure $P_I$ in the factory interface. Such a pump-up process, if performed quickly, can release various particles residing (adsorbed) on the walls of the load-lock chamber into the environment of the load-lock chamber. The released particles can land on the substrate and become contaminants. As in the case of the pump-down process, slowing down of the pump-up process reduces the number of detached (resuspended) particles, but results in a diminished manufacturing throughput. Existing technology involves splitting the pump-down process into two phases: a slow first phase and a fast second phase. The first phase is characterized by a first (low) flow rate (vent speed) and a corresponding slow increase of the pressure inside the load-lock chamber. The second phase begins with switching the flow rate to a second (increased) flow rate value. Subsequently, pressure increases much faster. Such a two-phase control of the flow rate reduces the number of particles that are likely to detach by limiting the rate at which pressure increases during the initial (and more sensitive) phase of the pump-up process. While reducing, to a certain degree, the number of contaminants released into the environment of the load-lock chamber, the existing two-phase technology provides limited flexibility and tunability, as the first and second vent speed values are set empirically.

Aspects and implementations of the present disclosure address these and other shortcomings of the existing pump-down and pump-up technology used in substrate manufacturing. Described herein are, among other things, implementations that enable determination of an optimal dynamics of pressure P(t) in the load-lock chamber during both the pump-down and the pump-up processes for minimizing the release of contaminants into the environment of the load-lock chamber. In some implementations, the minimization of the contaminants is based on simulations that account for actual physical processes that determine resuspension of particles into the environment during the pump-up stage and processes that determine vapor condensation during the pump-down stage. Additionally, a dynamic valve control setup is described that allows setting and controlling the flow rate F(t) of a gas flow into (or out of) the load-lock chamber at multiple points (time instances) of the respective processes. In some implementations, each of the pump-up and pump-down stages can involve setting three, four, etc. different flow rates computed to minimize occurrence of contaminants in the load-lock chamber. In some implementations, each of the pump-up and pump-down stages can involve a setting the flow rate flow rate F(t) continuously or quasi-continuously, which can involve setting (or adjusting) the flow rate F(t) at a large number N (e.g, N=10, 20, 50, etc.) of points over the duration of a respective stage.

FIG. 1 illustrates a schematic view of a processing system 100 (e.g., a substrate processing system), in accordance with some implementations of the present disclosure. The processing system 100 includes a factory interface (FI) 101 and load ports 128 (e.g., load ports 128A-D). In some implementations, the load ports 128A-D are directly mounted to (e.g., sealed against) FI 101. Enclosure systems 130 (e.g., cassette, FOUP, process kit enclosure system, or the like) are configured to removably couple (e.g., dock) to the load ports 128A-D. Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some implementations, one or more enclosure systems 130 are coupled to the load ports 128 for transferring substrates and/or other items into and out of the processing system 100. Each of the enclosure systems 130 may seal against a respective load port 128. In some implementations, a first enclosure system 130A is docked to a load port 128A. Once such operation or operations are performed, the first enclosure system 130A is undocked from the load port 128A, and then a second enclosure system 130 (e.g., a FOUP containing substrate) is docked to the same load port 128A. In some implementations, an enclosure system 130 (e.g., enclosure system 130A) is a system for performing a calibration operation or a diagnostic operation. In some implementations, an enclosure system 130 (e.g., enclosure system 130B) is a process kit enclosure system for transferring content 110 such as process kit rings into and out of the processing system 100.

In some implementations, a load port 128 includes a front interface that forms an opening. The load port 128 additionally includes a horizontal surface for supporting an enclosure system 130. Each enclosure system 130 has a front interface that forms a vertical opening. The front interface of the enclosure system 130 is sized to interface with (e.g., seal to) the front interface of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The front interface of the enclosure system 130 interconnects with (e.g., clamp to, be secured to, be sealed to) the front interface of the load port 128. A bottom plate (e.g., base plate) of the enclosure system 130 has features (e.g., load features, such as recesses or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130.

In some implementations, the enclosure system 130B (e.g., process kit enclosure system) includes one or more items of content 110 (e.g., one or more of a process kit ring, an empty process kit ring carrier, a process kit ring disposed on a process kit ring carrier, a placement validation wafer, etc.). In some examples, the enclosure system 130B is coupled to FI 101 (e.g., via load port 128) to enable automated transfer of a process kit ring on a process kit ring carrier into the processing system 100 for replacement of a used process kit ring.

In some implementations, the processing system 100 also includes first vacuum ports 103a, 103b coupling FI 101 to respective load-lock chambers 104a, 104b. Second vacuum ports 105*a*, 105*b* are coupled to respective load-lock chambers 104*a*, 104*b* and disposed between the load-lock chambers 104*a*, 104*b* and a transfer chamber 106 to facilitate transfer of substrates and other content 110 (e.g., process kit rings) into the transfer chamber 106. In some implementations, a processing system 100 includes and/or uses one or more load-lock chambers 104 and a corresponding number of vacuum ports 103, 105 (e.g., a processing system 100 includes a single load-lock chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some implementations, FI 101 is at a higher pressure (e.g., atmospheric pressure) and the transfer chamber 106 is at a lower pressure (e.g., vacuum). Each load-lock chamber 104 (e.g., degassing chamber) has a first door (e.g., first vacuum port 103) to seal the load-lock chamber 104 from FI 101 and a second door (e.g., second vacuum port 105) to seal the load-lock chamber 104 from the transfer chamber 106. Content is to be transferred from FI 101 into a load-lock chamber 104 while the first door is open and the second door is closed, the first door is to close, the pressure in the load-lock chamber 104 is to be reduced to match the transfer chamber 106, the second door is to open, and the content is to be transferred out of the load-lock chamber 104. A local center finding (LCF) device is to be used to align the content in the transfer chamber 106 (e.g., before entering a processing chamber 107, after leaving the processing chamber 107).

In some implementations, the processing chambers 107 includes or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as wafers. Alternatively, or additionally, the end effector is configured to handle objects such as a calibration substrate and process kit rings (edge rings). The robot arm has one or more links or members (e.g., wrist member, upper arm member, forearm member, etc.) that are configured to be moved to move the end effector in different orientations and to different locations.

The factory interface robot 111 is configured to transfer objects between enclosure systems 130 (e.g., cassettes, FOUPs) and load-lock chambers 104*a*, 104*b* (or load ports). The factory interface robot 111 is taught a fixed location relative to a load port 128 using the enclosure system 130 in implementations. The fixed location in one implementation corresponds to a center location of an enclosure system 130A placed at a particular load port 128, which in implementations also corresponds to a center location of an enclosure system 130B placed at the particular load port 128. Alternatively, the fixed location may correspond to other fixed locations within the enclosure system 130, such as a front or back of the enclosure system 130. The factory interface robot 111 is calibrated using the enclosure system 130 in some implementations. The factory interface robot 111 is diagnosed using the enclosure system 130 in some implementations.

Transfer chamber 106 includes a transfer chamber robot 112. Transfer chamber robot 112 includes a robot arm with an end effector at an end of the robot arm. The end effector is configured to handle particular objects, such as wafers. In some implementations, the transfer chamber robot 112 is a SCARA robot, but may have fewer links and/or fewer degrees of freedom than the factory interface robot 111 in some implementations.

A controller 109 controls various aspects of the processing system 100. The controller 109 is and/or includes a computing device such as a personal computer, a server computer, a programmable logic controller (PLC), a microcontroller, and so on. The controller 109 includes one or more processing devices, which, in some implementations, are general-purpose processing devices such as a microprocessor, central processing unit, or the like. More particularly, in some implementations, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some implementations, the processing device is one or more special-purpose processing devices such as an application specific integrated circuit (ASIC), a field programmable gate array (FPGA), a digital signal processor (DSP), network processor, or the like. In some implementations, the controller 109 includes a data storage device (e.g., one or more disk drives and/or solid state drives), a main memory, a static memory, a network interface, and/or other components. In some implementations, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends controls to factory interface robot 111 and wafer transfer chamber robot 112 in some implementations.

According to one aspect of the disclosure, to transfer content 110 (e.g., a substrate or a process kit ring) into a processing chamber 107, the content 110 is removed from a process kit enclosure system 130B via factory interface robot 111 located in FI 101. The factory interface robot 111 transfers the content 110 through one of the first vacuum ports 103*a*, 103*b* and into a respective load-lock chamber 104*a*, 104*b*. A transfer chamber robot 112 located in the transfer chamber 106 removes the content 110 from one of the load-lock chambers 104*a*, 104*b* through a second vacuum port 105*a* or 105*b*. The transfer chamber robot 112 moves the content 110 into the transfer chamber 106, where the content 110 is transferred to a processing chamber 107 though a respective port 108. After processing, the processed content 110 (e.g., a used process kit ring) is removed from the processing system 100 in reverse of any manner described herein.

The processing system 100 includes chambers, such as FI 101 (e.g., equipment front end module, EFEM) and adjacent chambers (e.g., load port 128, enclosure system 130, SSP, loadlock chamber 104 (such as a degassing chamber, or the like) that are adjacent to FI 101. Some or all of the chambers can be sealed. In some implementations, inert gas (e.g., one or more of nitrogen, argon, neon, helium, krypton, or xenon) is provided into one or more of the chambers (e.g., FI 101 and/or adjacent chambers) to provide one or more inert environments. In some examples, FI 101 is an inert EFEM that maintains the inert environment (e.g., inert EFEM minienvironment) within FI 101 so that users do not need to enter FI 101 (e.g., the processing system 100 is configured for no manual access within FI 101).

In some implementations, gas flow (e.g., inert gas, nitrogen) is provided into one or more chambers (e.g., FI 101) of the processing system 100. In some implementations, the gas flow is greater than leakage through the one or more chambers to maintain a positive pressure within the one or more chambers. In some implementations, the inert gas within FI 101 is recirculated. In some implementations, a portion of the inert gas is exhausted. In some implementations, the gas flow of non-recirculated gas into FI 101 is greater than the exhausted gas flow and the gas leakage to maintain a positive pressure of inert gas within FI 101. In some implementations, FI 101 is coupled to one or more valves and/or pumps to provide the gas flow into and out of FI 101. A processing device (e.g., of controller 109) controls the gas flow into and out of FI 101. In some implementations, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or out of FI 101.

The enclosure system 130 also allows for teaching, calibrating, and/or diagnosing a robot arm (e.g., of factory interface robot) without opening the sealed environment within FI 101 and adjacent chambers. The enclosure system 130 seals to the load port 128 responsive to being docked on the load port 128. The enclosure system 130 provides purge port access so that the interior of the enclosure system 130 can be purged prior to opening the enclosure system 130 to minimize disturbance of the inert environment within FI 101.

Figure 2:
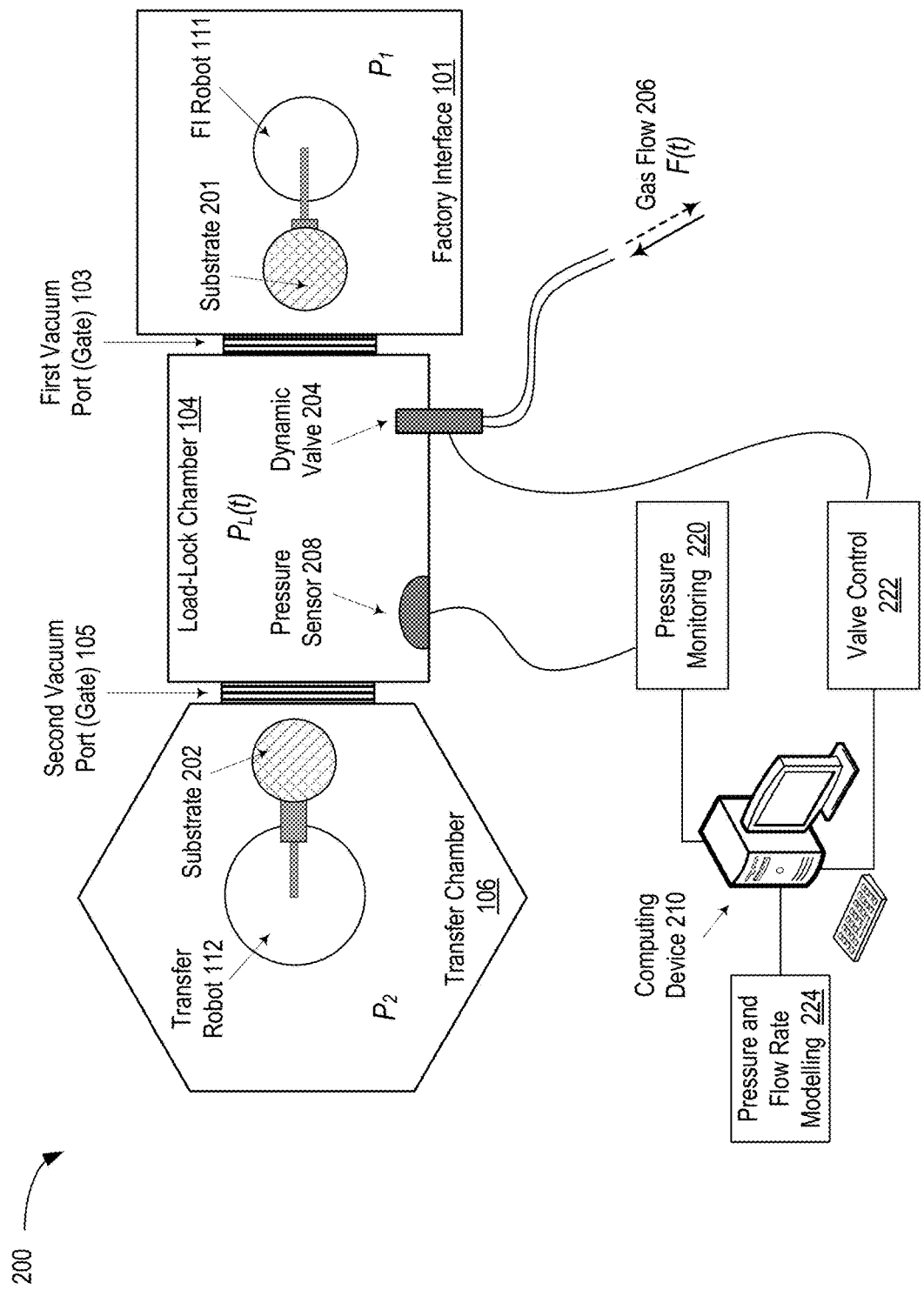
FIG. 2 illustrates a schematic view of a substrate processing system that enables efficient prevention of substrate contamination during pressure changes, in accordance with some implementations of the present disclosure.

FIG. 2 illustrates a schematic view of a substrate processing system 200 that enables efficient prevention of substrate contamination during pressure changes, in accordance with some implementations of the present disclosure. Electronic device processing system 200 includes FI 101 (or an equipment front end module), which interfaces with one or more substrate carriers, e.g., FOUPs (not shown). Additionally, FI 101 interfaces, via a first vacuum port 103 with the load-lock chamber 104. The load-lock chamber 104 further interfaces with the transfer chamber 106, via a second vacuum port 105. The transfer chamber 106 provides access to one or more processing chambers (not depicted in FIG. 2). The FI 101 and the transfer chamber 106 include respective robots 111 and 112 for transferring substrates 201 and 202 between the FI 101, the load-lock chamber 104, the transfer chamber 106, and the processing chambers.

The load-lock chamber 104 includes various equipment to monitor and control the environment therein. More specifically, the load-lock chamber 104 has a dynamic valve 204 to set a gas flow 206 at a gas flow rate F(t) into (solid arrow) or out of (dashed arrow) the load-lock chamber 104. Dynamic valve 204 is a fast-response valve capable of setting flow rate F(t) continuously or quasi-continuously in response to input control signals, as described in more detail below. The gas, whose flow is controlled by the dynamic valve 204, can be nitrogen, argon, xenon, krypton, or any other appropriate gas, e.g., a gas of a low reactivity that does not react with the substrates 201 and 202. The dynamic valve 204 settings indirectly control pressure P(t) in the load-lock chamber 104. The load-lock chamber 104 has a pressure sensor 208 to monitor pressure in the load-lock chamber 104. Although only one pressure sensor 208 is shown within the load-lock chamber 104 for conciseness, multiple pressures sensors can be placed at various locations of the load-lock chamber 104. Various other sensors can also be used. For example, monitoring of the environment of the load-lock chamber 104 can be performed using one or more temperature sensors, to measure temperature at one or more locations within the load-lock chamber 104, one or more chemical sensors to detect presence (and/or concentration) of contaminants at various locations within the load-lock chamber 104, one or more optical sensing devices (e.g., to monitor presence of contaminant particles), and the like.

The substrate processing system 200 includes a computing device 210 to implement pump-up and pump-down dynamics in accordance with this disclosure. The computing device 210 can be a desktop computer, a laptop computer, a workstation, a wearable device (a tablet, a smart phone, etc.), a cloud-based computing service, and the like. In some implementations, the computing device 210 is a dedicated microcontroller operating autonomously or in conjunction with another computing device. In some implementations, the computing device 210 controls multiple stages of substrate manufacturing, including receiving substrates in the FI 101, delivering the substrates to the transfer chamber 106 and the processing chambers, performing various processes therein (masking, etching, deposition, imaging, quality control, etc.), retrieving the processed substrates from the processing chambers, and so on. In addition to the above-listed operations, the computing device 210 performs more specific functions related to monitoring and controlling pressure inside the load-lock chamber 104.

In particular, computing device 210 has a pressure monitoring component 220, which collects pressure data (e.g., $P_{LL}(t)$), and other data from the load-lock chamber 104, including temperature data, optical sensor data, chemical sensor data, and the like. The computing device 210 further includes a valve control module 222 to adjust the rate F(t) of gas flow 206 into (or out of) the load-lock chamber 104 by providing to signals (e.g., analog or digital) to the dynamic valve 204. The pressure monitoring module 220 and the valve control module 222 operate in conjunction with a pressure and flow rate modeling 224 that identifies the target pressure P(t), and target flow rate F(t) representing the desired (e.g., optimal or close to optimal) dynamics of the pump-down and/or pump-up processes to be implemented in the load-lock chamber 104.

In one implementation, the modules and components of the computing device 210 operate as follows. In some implementations, the computing device 210 performs a technological process that involves the substrate processing system 200. In other implementations, computing device 210 is cognizant of a technological process that some other computing device is controlling and performs only a part of the whole process, e.g., computing device 210 controls the environment of the load-lock chamber 104, seals and unseals the load-lock chamber 104 prior to and after completion of the pump-down/pump-up processes, and so on. In some implementations, computing device 210 determines that the substrate 202 has undergone processing in one or more processing chambers and is ready to be moved from the transfer chamber 106 to one of the FOUPs docked at the FI 101. Computing device 210 then identifies that in the current technological process a given gas is in the transfer chamber 106 that is kept at pressure $P_T$. The computing device 210 further determines that the last time the unsealing of the load-lock chamber 104 occurred was by opening the first vacuum port 103 and that, therefore, the current pressure in the load-lock chamber 104 is at or close to the factory interface pressure $P_I$, which can be comparable to the atmospheric pressure. Accordingly, before the second vacuum port 105 can be opened for passage of the substrate 202, the pressure in the load-lock chamber 104 has to be decreased from $P_I$ to $P_T$. The computing device 210 further identifies that the pump-down process is to be completed within time τ. The type of gas, the initial pressure ($P_I$ in this example), the final pressure ($P_T$ in this example), and the time τ are then input into the pressure and flow rate modeling 224 for determination of the target pressure profile P(t), in accordance with the methods and techniques described below. Additionally, the pressure and flow rate modeling 224 determines the target gas flow F(t) to be implemented by the dynamic valve 204 to sustain target pressure profile P(t). In some implementations, the determination by the pressure and flow rate modeling 224 is performed prior to the start of the pump-down/pump-up processes and the target F(t) and P(t) are stored in a memory of the computing device 210.

Having received instructions to implement the target flow F(t) and pressure P(t), e.g., from the pressure and flow rate modeling 224 (or having retrieved such instructions previously stored target profiles F(t) and P(t) from the memory), the valve control module 222 outputs control signals to the dynamic valve 204 that sets and adjusts the target flow rate F(t). In some implementations, the control signals are output continuously. For example, the valve control module 222 can output an electric current I(t) (or voltage V(t)) to continuously control a flow rate through dynamic valve 204. In some implementations, the valve control module 222 outputs signals quasi-continuously, e.g., by changing the strength of the current (or voltage) signal every portion Δτ of the total duration τ of the pump-down (or pump-up) process. In some implementations, the signal strength changes many times over the total duration (such that Δτ≪τ). The pressure monitoring component 220, in the meantime, monitors the actual pressure $P_{LL}(t)$ inside the load-lock chamber 104 in real time and compares the actual pressure with the target pressure profile P(t), e.g. by computing the difference ΔP(t)=$P_{LL}$(t)−P(t). Depending on the sign of the difference ΔP(t) as well as on its magnitude, the valve control module 222 changes the signal output to the dynamic valve 204 to modify the gas flow 206 to bring the actual pressure $P_{LL}$(t) closer to the target pressure P(t). For example, when it is detected during the pump-down process that ΔP(t)>0, the valve control module 222 causes the dynamic valve 204 to increase the gas flow F(t) from the load-lock chamber 104. Conversely, when it is detected that ΔP(t)<0, the valve control module 222 causes the dynamic valve 204 to decrease the gas flow F(t). A similar process is followed during the pump-up process. For example, when it is detected during the pump-up process that ΔP(t)>0, the valve control module 222 causes the dynamic valve 204 to decrease the gas flow F(t) into the load-lock chamber 104. Conversely, when it is detected that ΔP(t)<0, the valve control module 222 causes the dynamic valve 204 to increase the gas flow F(t) into the load-lock chamber 104.

Although the above examples and the rest of the disclosure refer to the processes performed to equalize pressure between the load-lock chamber and the transfer chamber (the pump-down stage) or between the load-lock chamber and the factory interface (the pump-up stage), the disclosed methods and systems are applicable for pressure equalization between any two or more chambers of various manufacturing systems with particle-sensitive environments.

Figure 3:
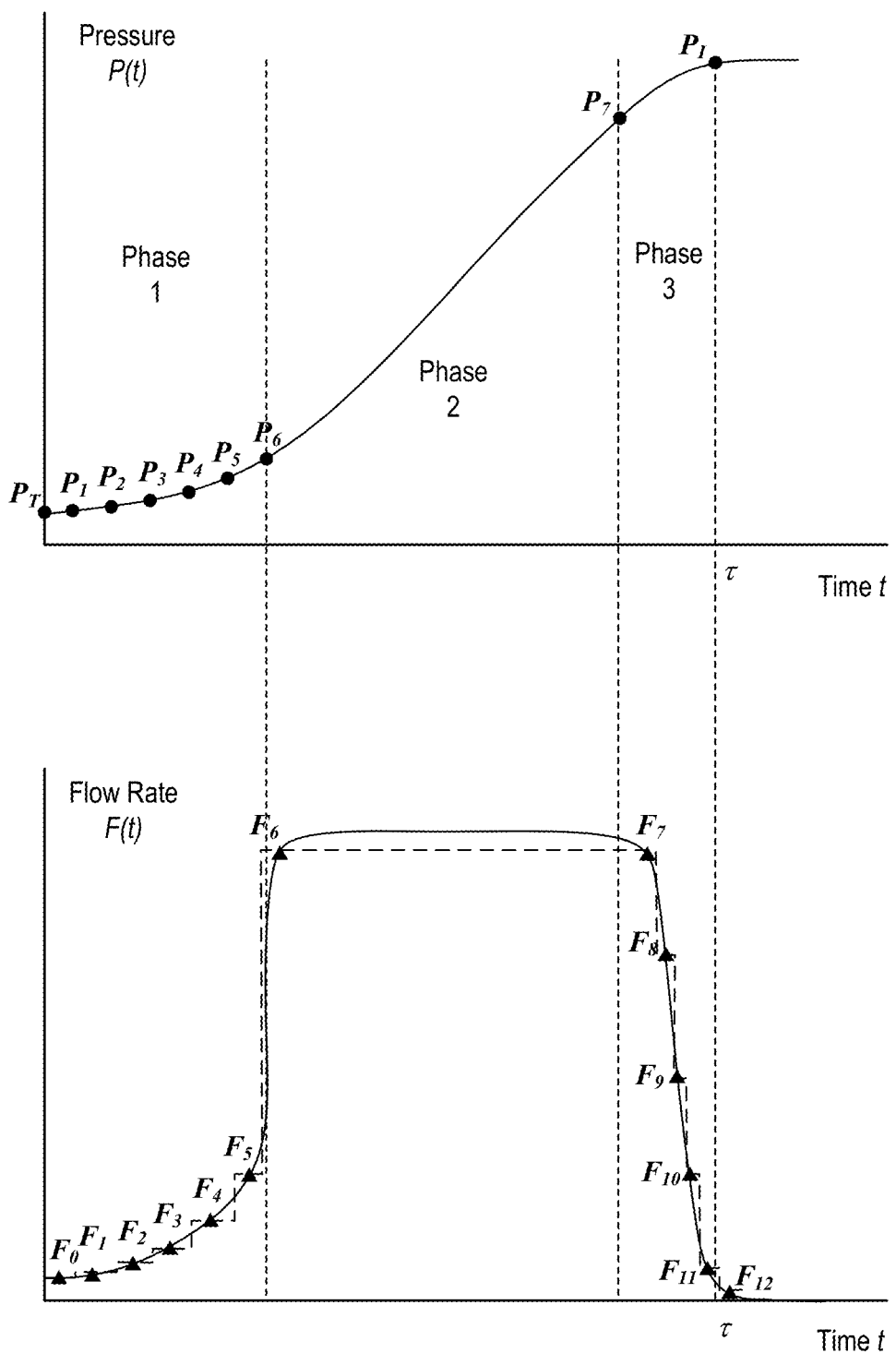
FIG. 3 depicts schematically dynamics of pressure (upper plot) and flow of gas (lower plot) into a load-lock chamber determined to minimize contamination of substrates during a pump-up stage of the substrate manufacturing, in accordance with some implementations of the present disclosure.

FIG. 3 depicts schematically dynamics of pressure (upper plot) and flow of gas (lower plot) into a load-lock chamber determined to minimize contamination of substrates during a pump-up stage of the substrate manufacturing, in accordance with some implementations of the present disclosure. Depicted pressure curve P(t) is subdivided into three phases, for ease of discussion. During Phase 1, pressure in the load lock chamber is relatively low (starting with $P_T$(t) as low as 1 Torr, or even lower). When pressure in the chamber is low, the likelihood of a particle detaching from a surface (resuspension) is higher than when the pressure is higher. Additionally, when the pressure is low, fast increases in the pressure P(t), caused by a large flow of gas F(t), which causes substantial aerodynamic drag forces near particles adsorbed on the surfaces, are also more likely to cause detachment of particles. For example, if a flow rate F(t), is measured in units of volume per time (e.g., cm³/sec), in case of adiabatic increase of pressure, dP(t)/dt=γP(t)F(t)/V, where V is the volume of the chamber and γ is the adiabatic index (e.g., γ=7/5 for molecular nitrogen); and in case of isothermal increase, dP(t)/dt=P(t)F(t)/V. Accordingly, as shown by the bottom plot in FIG. 3, Phase 1 is characterized by a relatively low (but continuously increasing) flow rate F(t) and pressure P(t). Phase 1 ("Slow vent" phase) continues until some level of pressure P(Phase 2) is achieved, depicted in FIG. 3 as $P_6$. In some implementations, pressure P(Phase 2)~20-25 Torr, but it should be understood that pressure P(Phase 2) can vary depending on the volume of the chamber V, the type of gas being used, the type and quality of the surface of the chamber, the type of adsorbed particles that are likely to be present within the environment of the chamber, and so on. After pressure P(Phase 2) is reached, likelihood of resuspension decreases and higher flow rates can be used without causing many additional particles to resuspend. Consequently, Phase 2 ("Fast vent") commences. In some implementations, during Phase 2, flow rate is increased relatively quickly to a maximum rate $F_{max}$ and then maintained at that level. In some implementations, the flow rate in Phase 2 is a maximum rate, as specified by a human (e.g., system engineer). In some implementations, the maximum rate $F_{max}$ is computed by the pressure and flow rate modeling 224 based on a target duration τ of the pump-up process. In some implementations, the target duration τ can in turn be determined based on a target throughput (a number of substrates processed within a specific time). In some implementations, the maximum flow rate $F_{max}$ is a flow rate that is comparable to an ultimate flow rate $F_{ult}$ supported by dynamic valve 204 and valve control module 222, e.g., $F_{max}/F_{ult}$=0.8, 0.85, 0.9, etc. The maximum flow rate $F_{max}$ being somewhat lower than the ultimate flow rate $F_{ult}$ can be used in the instances when the actual pressure $P_{LL}$(t) lags behind the target curve P(t) and an increase in the flow rate above $F_{max}$ is used to bring the current pressure dynamics closer to the target curve. In some implementations, Phase 3 ("Tail") commences when pressure P(t) approaches the target pressure, e.g. pressure $P_I$ in the factory interface. During Phase 3, flow rate F(t) is smoothly but quickly decreased from the flow rate used during Phase 2 (e.g., maximum pressure $F_{max}$) to zero. For example, the duration of Phase 3 is selected in such a way that the pressure reaches the intended pressure $P_I$ at the intended instance of time τ (counted from the start of the pump-up process) without exceeding $P_I$. For example, assuming the time to shut off the dynamic valve to be Δt (this time can be known from the valve's specification or determined via empirical testing) and approximating the average flow rate during Phase 3 to be $F_{max}/2$, the average rate of increase of the pressure during Phase 3 (for isothermal pump-up) can be estimated as:

$$\langle \frac{dP}{dt} \rangle = \frac{P_I F_{max}}{2V},$$

wherein it is further assumed that the pressure at the start of Phase 3 is not significantly different from final pressure $P_I$. Accordingly, Phase 3 can be commenced once the pressure in the chamber has reached the value $$P(\text{Phase 3}) = P_I - \frac{P_I F_{max}}{2V} \Delta t.$$

This example is intended as illustration only, as many other flow rate profiles $F(t)$ can achieve implement substantially similar objective of an efficient tailing of the pump-up process. The advantage of having Phase 3 is two-fold. On one hand, no time is wasted bringing the pressure down from above $P_I$, if $P(t)$ overshoots $P_I$ at any time during the pump-up process. On the other hand, Phase 3 ensures that pressures in the load-lock chamber and in the factory interface equalize accurately and no disturbance of the environment of either chamber occurs upon unsealing the gate between the chambers (as might otherwise happen, if the two pressures were different).

In some implementations, flow rate $F(t)$ is set quasi-continuously, by specifying a discrete set of flow rates $F_j$ (depicted with black triangles in the bottom plot in FIG. 3 and the dashed line), e.g., as can be set by a dynamic valve at pre-determined instances of time $t_j$ to ensure that the pressure in the chamber follows a set of target pressure values $P_j$ (depicted with black circles in the top plot in FIG. 3). A number of flow rates $F_j$ can be specified (e.g., from as low as three to as many as several tens or even more). For example, as depicted in a non-limiting example in FIG. 3, thirteen different flow rates are specified over the duration of the pump-up process, with values $F_0$ through $F_5$ implementing Phase 1 (corresponding to target pressure values $P_1$ through $P_6$), value $F_6$ implementing Phase 2 (corresponding to target pressure values $P_6$ and $P_7$) and values $F_7$ through $F_{12}$ implementing Phase 3 (leading up to the intended pressure $P_I$).

Figure 4:
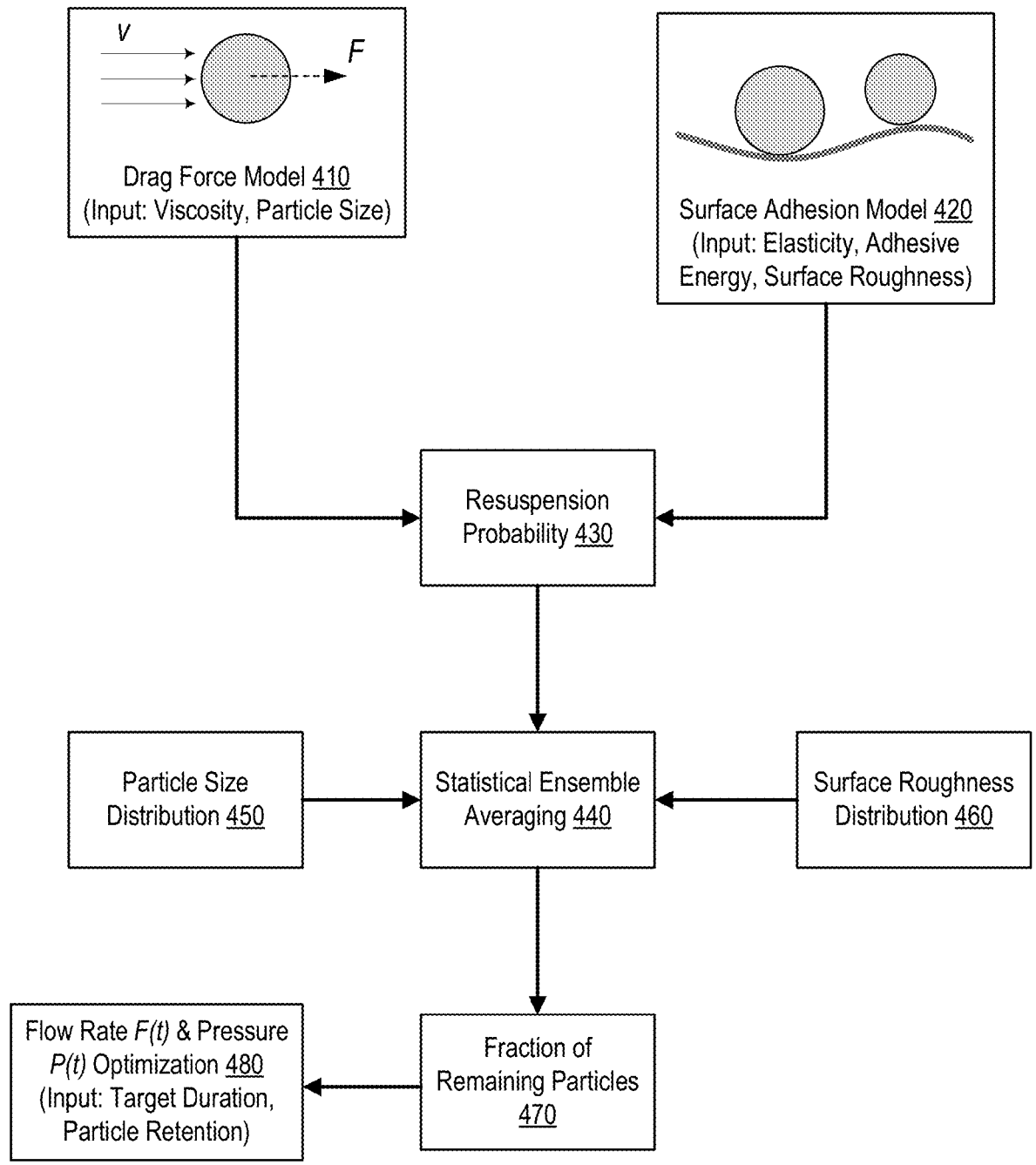
FIG. 4 is a schematic illustration of an example algorithm that used to determine target pressures and flow rates for a pump-up process that reduces presence of contaminants in substrate processing systems, in accordance with some implementations of the present disclosure.

FIG. 4 is a schematic illustration of an example algorithm 400 that used to determine target pressures and flow rates for a pump-up process that reduces presence of contaminants in substrate processing systems, in accordance with some implementations of the present disclosure. Example algorithm 400 can use multiple physical and statistical models to ensure accuracy of predictions under realistic modeling conditions. In some implementations, example algorithm 400 includes a drag force model 410 that is based on equations of aerodynamics. In one example, drag force model 410 uses particle size (e.g., diameter) and viscosity (e.g., dynamic or kinematic viscosity) of the gas. Drag force model 410 determines, e.g., based on viscosity of the gas, a profile of the aerodynamic flow near a surface of the chamber (e.g., variation of the velocity of the flow with the distance from the surface), and further determines the force acting on the particle attached to the surface.

In some implementations, example algorithm 400 includes a surface adhesion model 420 that determines the amount of force that is to be applied to a given particle to detach the particle from the surface. The particle is characterized by its size, density, shape (e.g., spherical, ellipsoidal, rod-shaped, etc.). The surface is characterized by surface roughness, which can include a lateral scale of a surface profile variation, a vertical (perpendicular to the surface) scale of the surface profile, and the like. Interaction of the particle with the surface can be modeled using various mechanisms. For example, in one mechanism, adhesion of the particle to the surface is modeled using a spring model.

In some implementations, a static or dynamic model is used. In the dynamic model, drag force is a fluctuating, e.g., random, function of time having a specific average value (in the direction of the flow of gas) and fluctuation around that average value (which itself depends on the average velocity of the flow of gas).

In some implementations, output of drag force model 410 (characterizing drag forces experienced by particles of various sizes) and surface adhesion model 420 (characterizing conditions for detachment of particles) are used to determine a resuspension probability (block 430) for a given particle. For example, a particle of a given size and placed in a given flow of gas (determined by a specified flow rate $F(t)$ in view of a particular chamber geometry) performs a motion that has a certain probability of reaching conditions for detachment from the surface. For example, a drag force computed using drag force model 410 and applied as an input into surface adhesion model 420 can cause a specific extension $\Delta l(t)$ of a spring as a function of time. Based on the likelihood that $\Delta l(t)$ exceeds a threshold extension for the particle's detachment, per-unit-time resuspension probability 430 is determined. In some implementations, resuspension (detachment) probability $p(F_t/F_d)$ is a function (e.g., a model function) that depends on (i) the ratio of a threshold force $F_t$ needed to pull the particle from the surface and (ii) the actual drag force $F_d$ acting on the particle. The function $p(F_t/F_d)$ can be an exponential function, a power-law function, or some other function. In some implementations, $p(F_t/F_d)$ approaches zero as $F_t/F_d$ becomes large (weak drag) and increases as $F_t/F_d$ decreases (strong drag).

Resuspension probability 430 can be determined for a specific particle (size, shape, etc.) and a specific condition of the surface (adhesive energy, elastic properties of the surface, surface roughness, etc.). Resuspension probability 430 may be used in statistical ensemble averaging 440. Input to statistical ensemble averaging 440 also includes particle size distribution 450, surface roughness distribution 460, distribution of adhesion energies, and the like. Statistical ensemble averaging, applied to resuspension probability determines an average probability of resuspension for an ensemble or particles attached to the surface of the chamber. Based on statistical ensemble averaging 440, integration over time is performed and a fraction of remaining particles 470 is determined as a function of time.

In some implementations, fraction of remaining particles 470, e.g., $\eta(t) = \eta[F(t), V, P_T, P_I]$, is determined in view of the dynamics of the flow rate $F(t)$ selected for the chamber, which in turn determines (for a known volume V of the chamber) the dynamics of the pressure in the chamber $P(t)$ starting from the initial pressure (e.g., transfer chamber pressure) $P_T$ and ending at the final pressure (e.g., factory interface pressure) $P_I$. Various models and blocks of algorithm 400 can be iterated multiple times, e.g., in time increments $\Delta t$. For each time increment, updated conditions for resuspension can be recomputed based on the current pressure $P(t)$ and a new updated flow rate $F(t+\Delta t)$. A new drag force and new resuspension probability is then determined by the respective blocks of algorithm 400 and a statistical ensemble averaging 440 is performed to obtain the derivative of the fraction of the remaining particles, $-\Delta\eta(t)/\Delta t$. Based on the value of the derivative at each time increment, the final fraction of the remaining particles at the end of the pump-up process, $\eta(\tau)$, is determined. Consequently, using simulations performed by blocks 410-470, a flow and pressure optimization 480 identifies a target flow rate F(t) in view of the target duration $\tau$ and the target fraction of particles $\eta$(Target) to remain adsorbed (attached to the surface). The target fraction of particles depends on a particular technological process being implemented (e.g., by a target quality of the manufacturing product), and can be 70%, 80%, 90%, or any other value.

Figure 5:
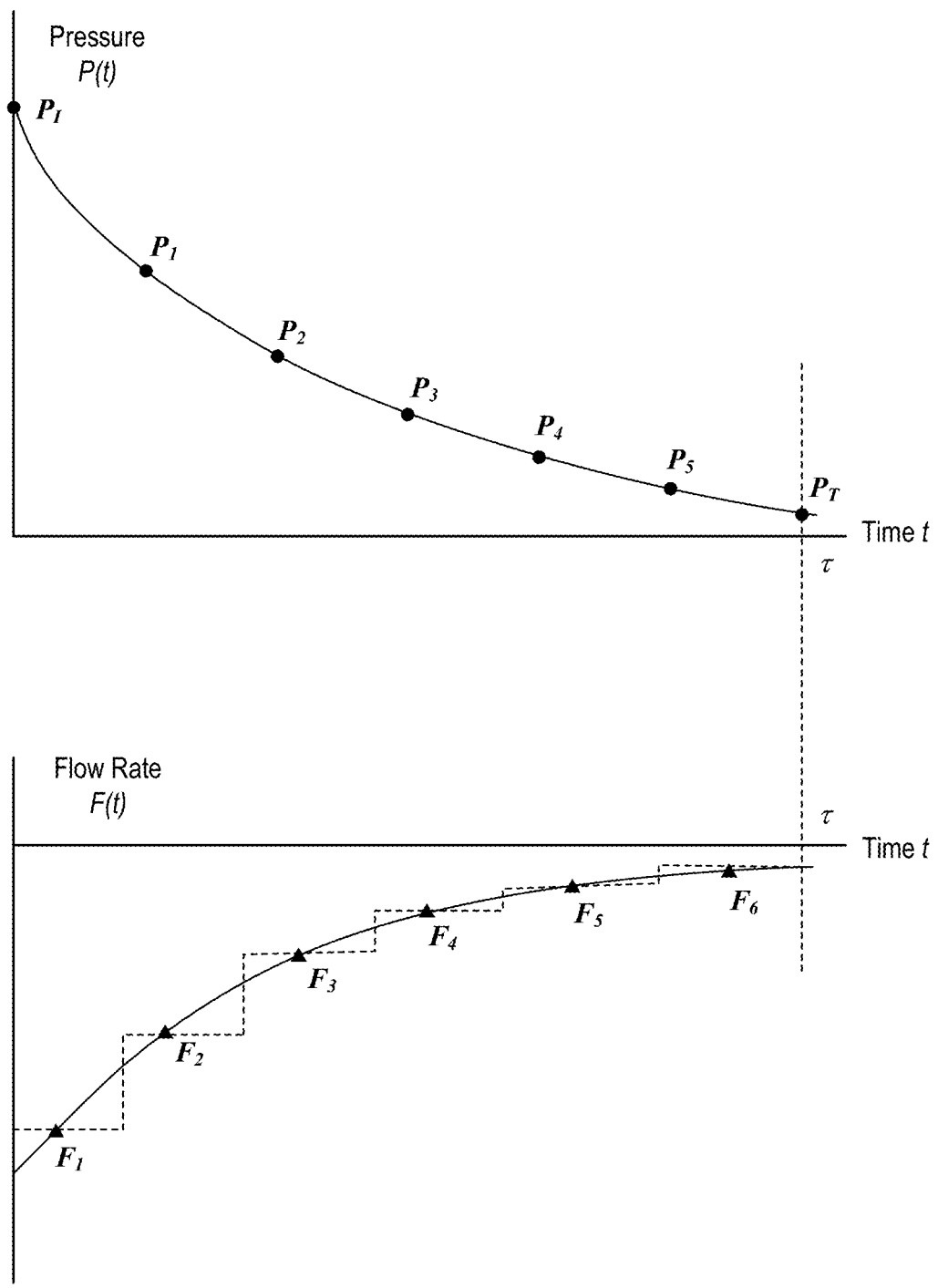
FIG. 5 depicts schematically dynamics of pressure (upper plot) and flow of gas (lower plot) out of a load-lock chamber determined to minimize condensation of liquids during a pump-down stage of the substrate manufacturing, in accordance with some implementations of the present disclosure.

FIG. 5 depicts schematically dynamics of pressure (upper plot) and flow of gas (lower plot) out of a load-lock chamber determined to minimize condensation of liquids during a pump-down stage of the substrate manufacturing, in accordance with some implementations of the present disclosure. Depicted is a target pressure curve P(t) that can be determined as described below in conjunction with FIG. 6. The target pressure curve P(t) starts with initial pressure $P_I$, which can be pressure in the factory interface, and continues until final pressure $P_T$ is achieved, which can be pressure in the transfer chamber. The target flow rate F(t) of the flow of gas out of the load-lock chamber (used to implement the target pressure P(t)) is depicted schematically in the lower plot; the negative sign of the flow rate underscores that the flow of gas is out of the chamber.

In some implementations, flow rate F(t) is set quasi-continuously, by specifying a discrete set of flow rates $F_j$ (depicted with black triangles and the dashed line), e.g., as set by a controller via a dynamic (continuous) valve at pre-determined instances of time $t_j$. The flow rates $F_j$ are set to ensure that the pressure in the chamber follows a set of target pressure values $P_j$ (depicted with black circles in the top plot in FIG. 5). A number of flow rates $F_j$ can be as low as three and as many as several tens or even more.

Figure 6:
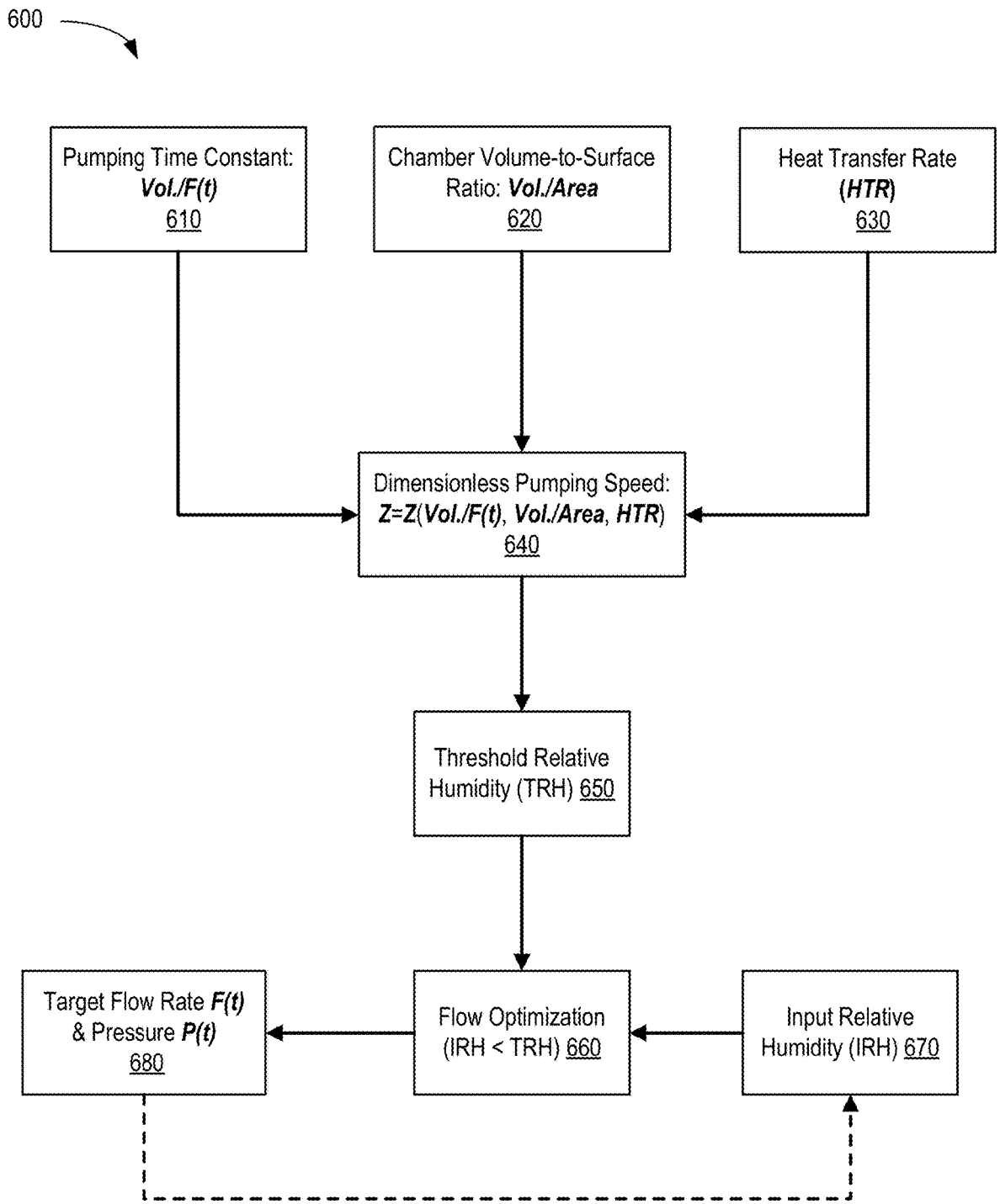
FIG. 6 schematic illustrates an example algorithm used to determine target pressures and flow rates during a pump-down process that reduces condensation of liquids in substrate processing systems, in accordance with some implementations of the present disclosure.

FIG. 6 schematic illustrates an example algorithm 600 used to determine target pressures and flow rates during a pump-down process that reduces condensation of liquids in substrate processing systems, in accordance with some implementations of the present disclosure. Example algorithm 600 can use various physical models to ensure accuracy of predictions under realistic modeling conditions. In some implementations, example algorithm 600 determines a pumping time constant (block 610), which can be a ratio of the volume of the chamber to the (instantaneous) flow rate F(t). Although referred to as a "constant," the pumping time constant actually varies with a change of the flow rate. In some implementations, example algorithm 600 further determines a chamber volume-to-surface ratio (block 620) for a specific chamber being modeled. In some implementations, example algorithm 600 also determines a heat transfer rate (block 630). Heat transfer rate indicates how efficiently heat is exchanged between various regions of the chamber (e.g., via a convective exchange).

The determined pumping time constant, chamber volume-to-surface ratio, and heat transfer rate can be combined into a dimensionless pumping speed Z (block 640). The dimensionless pumping speed may be used (at block 650) to identify a threshold humidity (for a given value of Z), $RH_T(Z)$. At block 660, the actual input relative humidity RH (block 670) is compared with the threshold humidity. The target flow rate F(t) and the target pressure P(t) are then determined (at block 680) from the condition that the actual humidity is to remain below the threshold humidity $RH \le RH_T(Z)$ at various (e.g., all) instances of the pump-down process. In some implementations, the target flow rate F(t) and target pressure P(t) is obtained from the modified condition $RH = \alpha \cdot RH_T(Z)$ where for additional safety, a factor $\alpha < 1$ is be used, such that $\alpha = 0.95$, 0.9, 0.85, etc. This additional safety factor can be used as a safety cushion to prevent formation of a condensate when unexpected deviation of pressure in the chamber from the target pressure (or various other fluctuations of the environment of the chamber) occur.

Figure 7A:
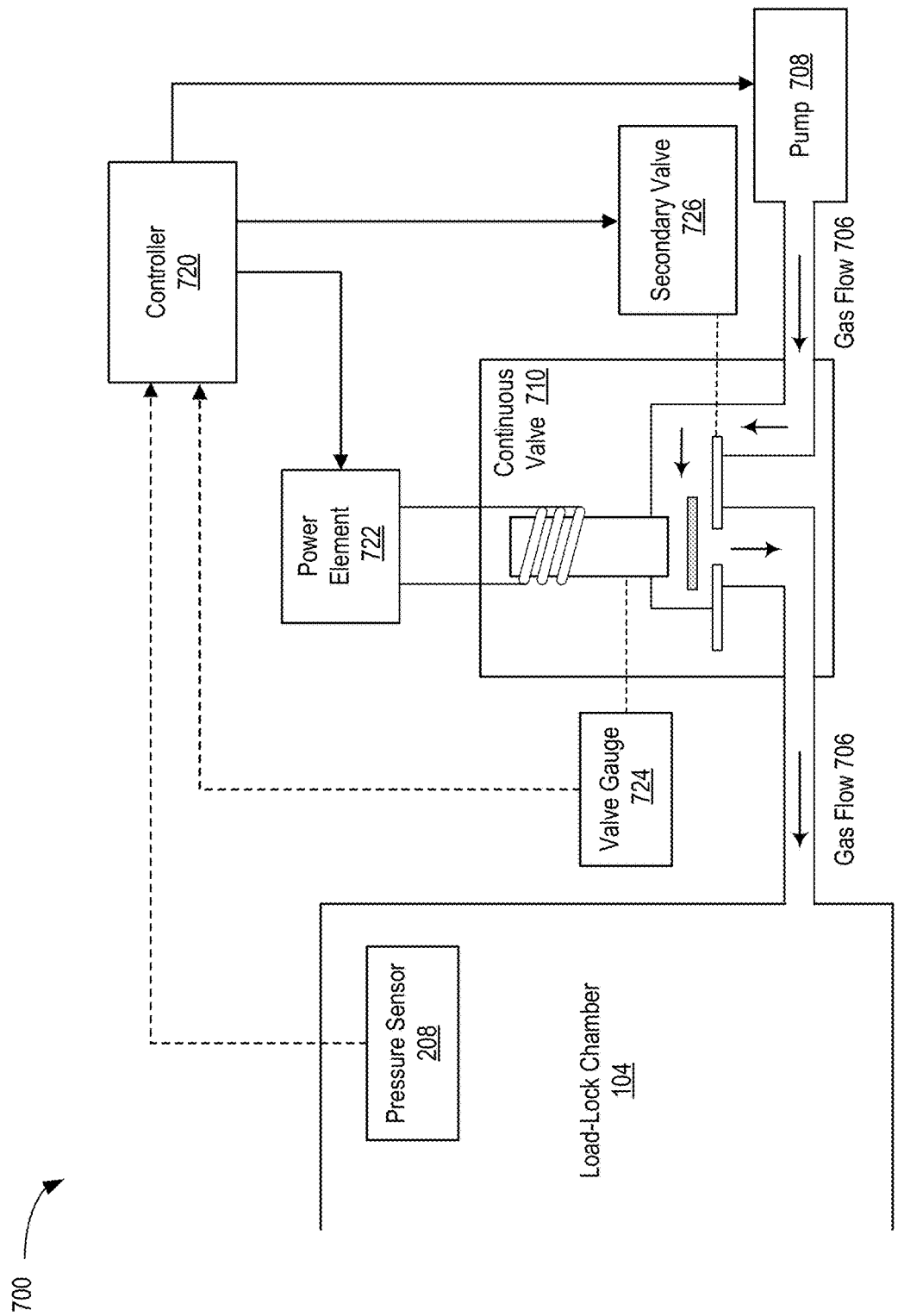
FIG. 7A is an example valve control system that can be used to prevent contamination of products in substrate processing systems during pressure changes, in accordance with some implementations of the present disclosure.

FIG. 7A is an example valve control system 700 that can be used to prevent contamination of products in substrate processing systems during pressure changes, in accordance with some implementations of the present disclosure. Valve control system 700 uses the same gas flow path during the pump-down and pump-up processes. In some implementations, valve control system 700 effectuates target flow/pressure dynamics determined for a particular manufacturing process by algorithm 400 of FIG. 4 and/or algorithm 600 of FIG. 6. Depicted in FIG. 7A is a load-lock chamber 104 receiving a gas flow 706 from a pump 708 via a continuous (dynamic) valve 710 during a pump-up stage. (During a pump-down stage, the direction of gas flow 706 is reversed.) A controller 720 controls operations of continuous valve 710. In various implementation, continuous valve 710 can be a solenoid valve, a butterfly valve, or any other valve capable of a continuous flow control. Controller 720 includes one or more processing devices, such as central processing units (CPUs), application-specific integrated circuits (ASICs), field programmable gate arrays (FPGAs), digital signal processors (DSPs), network processors, or the like. The processing device(s) is (are) communicatively coupled to one or more memory devices, such as read-only memory (ROM), flash memory, static memory, dynamic random access memory (DRAM), and the like. Controller 720 can be a part of a desktop computer, a laptop computer, a workstation, a wearable device (e.g., a tablet, a smart phone, etc.), a cloud-based computing service, and the like. In some implementations, controller 720 is a dedicated microcontroller configured to perform pump-up and/or pump-down processes in substrate processing systems. In some implementations, controller 720 is a part of a larger network of computing devices. In some implementations, an outside computing device communicating with controller 720 is capable of reconfiguring (e.g., changing settings, updating memory, or otherwise reprogramming) controller 720.

In one implementation, controller 720 outputs control signals (e.g., analog signals) to a power element 722 that provides voltage or current input into continuous valve 710. The input provided by power element 722 causes an internal state of continuous valve 710 to alter. For example, current output by power element 722 causes magnetic field of a solenoid to increase or decrease and, consequently, causes a magnetic-field-actuated plunger to partially obstruct an orifice to modify gas flow 706 to a desired degree. Various other dynamic valves (e.g., ball valves, butterfly valves, flap valves) capable if continuous control of gas flow can be used instead of a solenoid valve. Power element 722 can include a battery, a generator, a capacitor, a rechargeable battery or any other source of electric current. Power element 722 can further include one or more circuit elements to allow precision control of the output current (or voltage), such as current/voltage dividers, stabilizers, bridges, feedback loops, ammeters, voltmeters, and the like. In some implementations, power element 722 includes a direct current source. In some implementations, power element 722 includes an alternating current source, which is further used in conjunction with transformers, rectifiers, and other elements.

Controller 720 (as indicated by a dashed arrow) can exercise additional control over continuous valve 710 using a valve gauge 724. Valve gauge 724 can be (or can include) any sensor collecting data about an internal state of continuous valve 710. Valve gauge 724 can monitor (e.g., in real-time) internal valve metrics indicative of the obstruction of gas flow 706 by a mechanism of the valve, which can include a position of the plunger, an angle of the flap, a velocity of gas flow 706 near a constricted area of the valve, and the like. Valve gauge 724 serves as an additional check for controller 720 to verify settings of continuous valve 710 and as part of a feedback loop to enhance accuracy of set gas flow 706. In one example, controller 720 directs power element 722 to output current I to continuous valve 710 so that the valve allows a gas flow F(I) there through. On the other hand, valve gauge 724 indicates that a smaller flow F(I)–ΔF than intended has been set by valve gauge 724. Controller 720 then directs power element 722 to increase current to I+ΔI (or decrease to I–ΔI, depending on the design of the valve) to compensate for the deficit F. In some instances, compensation is achieved iteratively, by incrementing or decrementing the current ΔI (or other signal) several times. In some implementations, instead of (or in addition to) adjusting the signal output by power element 722, controller 720 adjusts settings of pump 708 to increase gas flow pumped through continuous valve 710.

In some implementations, a secondary valve 726 enables additional control over operations of continuous valve 710 and further improves precision with which rate of flow of gas into load-lock chamber 104 is set. Secondary valve 726 can be utilized to control some additional state of continuous valve 710, gas flow 706, or delivery system that delivers gas flow 706. In some implementations, secondary valve 726 is packaged together with continuous valve 710, e.g., as a part of an internal mechanism of continuous valve 710. For example, secondary valve 726 can control a size of the orifice, a shape of the orifice, a distance between the orifice and movable parts of continuous valve 710, and so on. In some implementations, secondary valve 726 is located outside continuous valve 710. For example, secondary valve 726 can be used to control a cross-sectional area of a delivery line that delivers gas from pump 708 to continuous valve 710 or a cross-sectional area of a delivery line that delivers gas from continuous valve 710 to load-lock chamber 104. In some implementations, secondary valve 726 is connected in parallel to continuous valve 710, e.g., secondary valve 726 controls gas flow through a bypass around continuous valve 710. In some implementations, secondary valve 726 is also a continuous valve, e.g., a proportional valve whose settings are determined in proportion to a signal from controller 720. In some implementations, secondary valve 726 has a number of discrete settings. For example, as gas flow 706 is increased (or decreased), controller 720 causes secondary valve 726 to change the size (e.g., cross section) of the orifice of continuous valve 710 discontinuously (e.g., in ΔA increments). At the same time, the control signal provided to continuous valve 710 is likewise changed discontinuously (e.g., the distance from the plunger of the solenoid to the orifice is decreased), to compensate for the change of the orifice and ensure that the flow of gas increases continuously though the change of the orifice. Subsequently, as settings of secondary valve 726 remain fixed for some time, settings of continuous valve 710 change continuously until the next change in discrete settings of secondary valve 726. This process is repeated until the stage (pump-down or pump up) is complete.

Pressure sensor 208 enables global control over pump-up and pump-down processes, as described above in conjunction with FIG. 3 and FIG. 5. Pressure readings from pressure sensor 208 received by controller 720 enable controller 720 to determine if the pump-up process or the pump-down process is implemented according to the target profile P(t) identified as described in conjunction with FIG. 4 and FIG. 6. Depending on whether the process is ahead or behind the target schedule, controller 720 increases or decreases flow rate by adjusting settings of continuous valve 710 and, optionally, secondary valve 726.

Figure 7B:
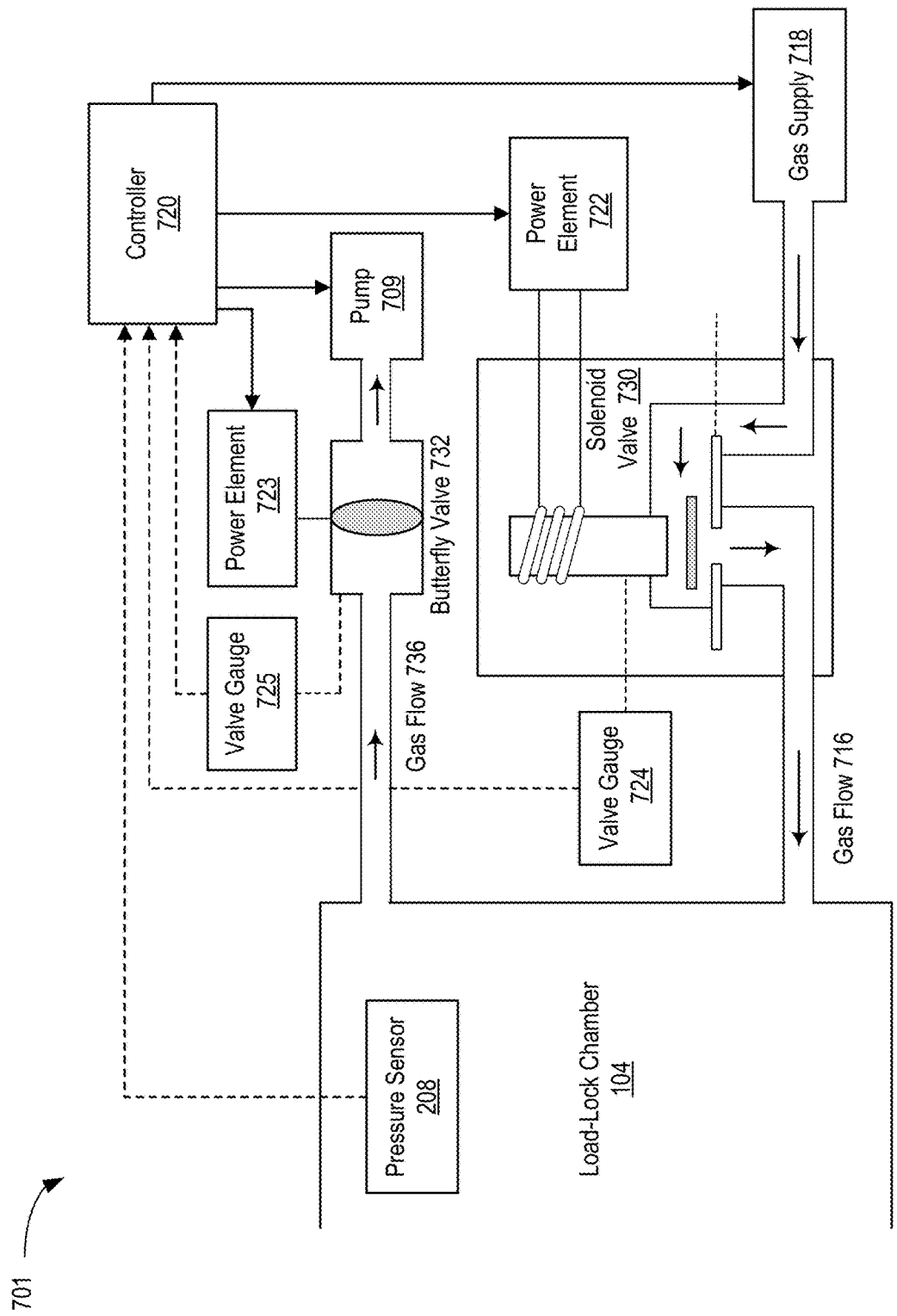
FIG. 7B is another example valve control system to prevent contamination of products in substrate processing systems during pressure changes, in accordance with some implementations of the present disclosure.

FIG. 7B is another example valve control system 701 that can be used to prevent contamination of products in substrate processing systems during pressure changes, in accordance with some implementations of the present disclosure. Valve control system 701 uses different gas flow paths during the pump-down and the pump-up processes. As depicted schematically, during a pump-up stage, a gas flow 716 into load-lock chamber 104 can be provided by a gas supply 718, which can be (or include) a pressurized gas container, a pump, and/or other suitable components and devices. Gas flow 716 can be controlled by any continuous valve, similarly to how continuous valve 710 of valve control system 700 depicted in FIG. 7A controls gas flow 706 (e.g., using power element 722 receiving control signals from controller 720). The continuous valve can be a solenoid valve 730 (as depicted), a proportional valve, a butterfly valve, or any other valve enabling continuous (or quasi-continuous) adjustment of the flow rate. The state of solenoid valve 730 can be monitored by controller 720 using valve gauge 724.

During a pump-down stage, controller 720 can cause solenoid valve 730 (or any other continuous valve) to be closed and gas flow 716 into load-lock chamber 104 to be stopped. Controller 720 can initiate a gas flow 736 out of load-lock chamber 104 by causing another continuous valve, e.g., butterfly valve 732, to control gas flow 736. Although butterfly valve 732 is depicted in FIG. 7B, gas flow 736 can be controlled by any continuous valve, e.g., a solenoid valve, a proportional valve, or any other valve capable of continuous (or quasi-continuous) regulation of the flow rate. Gas flow 736 can be sustained by a pump 709, which can be separate from gas supply 718. In some implementations, pump 709 can be directing the flow of gas to gas supply 718 to be reused during the subsequent pump-up stages. In some implementations, the flow of gas can be directed to an exhaust (not shown) and not reused during the pump-up stages. The state of butterfly valve 732 can be set by a power element 723 controlled by controller 720. Power element 723 can be separate from power element 722 (as depicted); in some implementations, power element 723 and power element 722 can be combined into a single power supply. The state of butterfly valve 732 can be monitored by controller 720 using valve gauge 725. In some implementations, additional (secondary) valves can be connected in parallel or in series to solenoid valve 730 and/or butterfly valve 732, as described in more detail above in conjunction with FIG. 7A.

Figure 8:
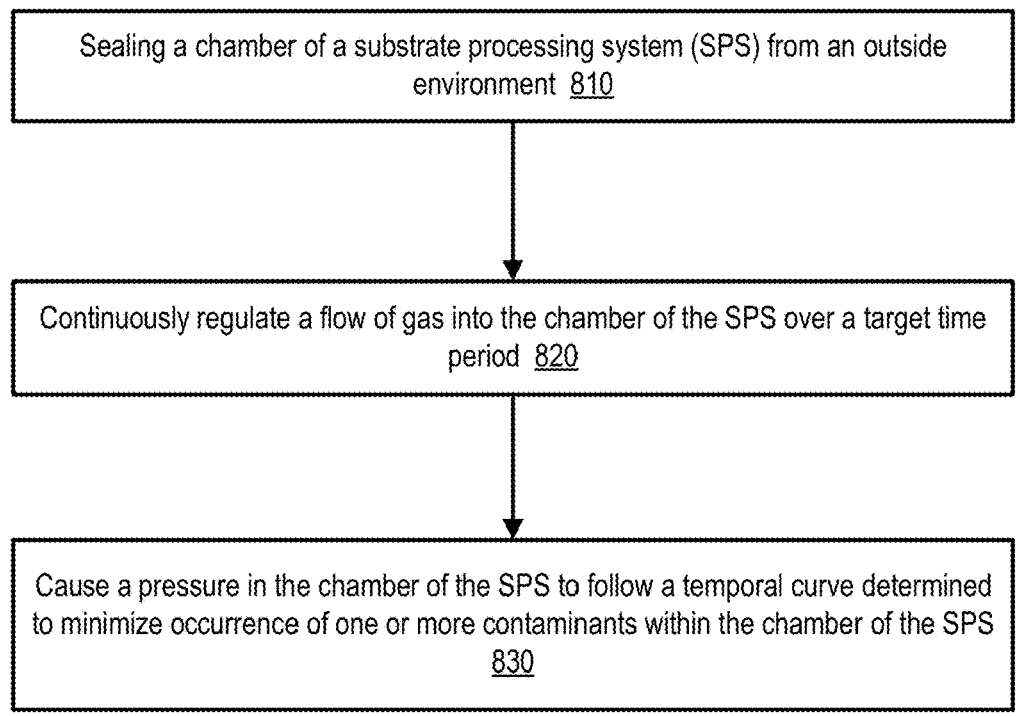
FIG. 8 is a flow diagram of a method of enacting pressure changes that minimize occurrence of contaminants in substrate processing systems, in accordance with some implementations of the present disclosure.
Figure 9:
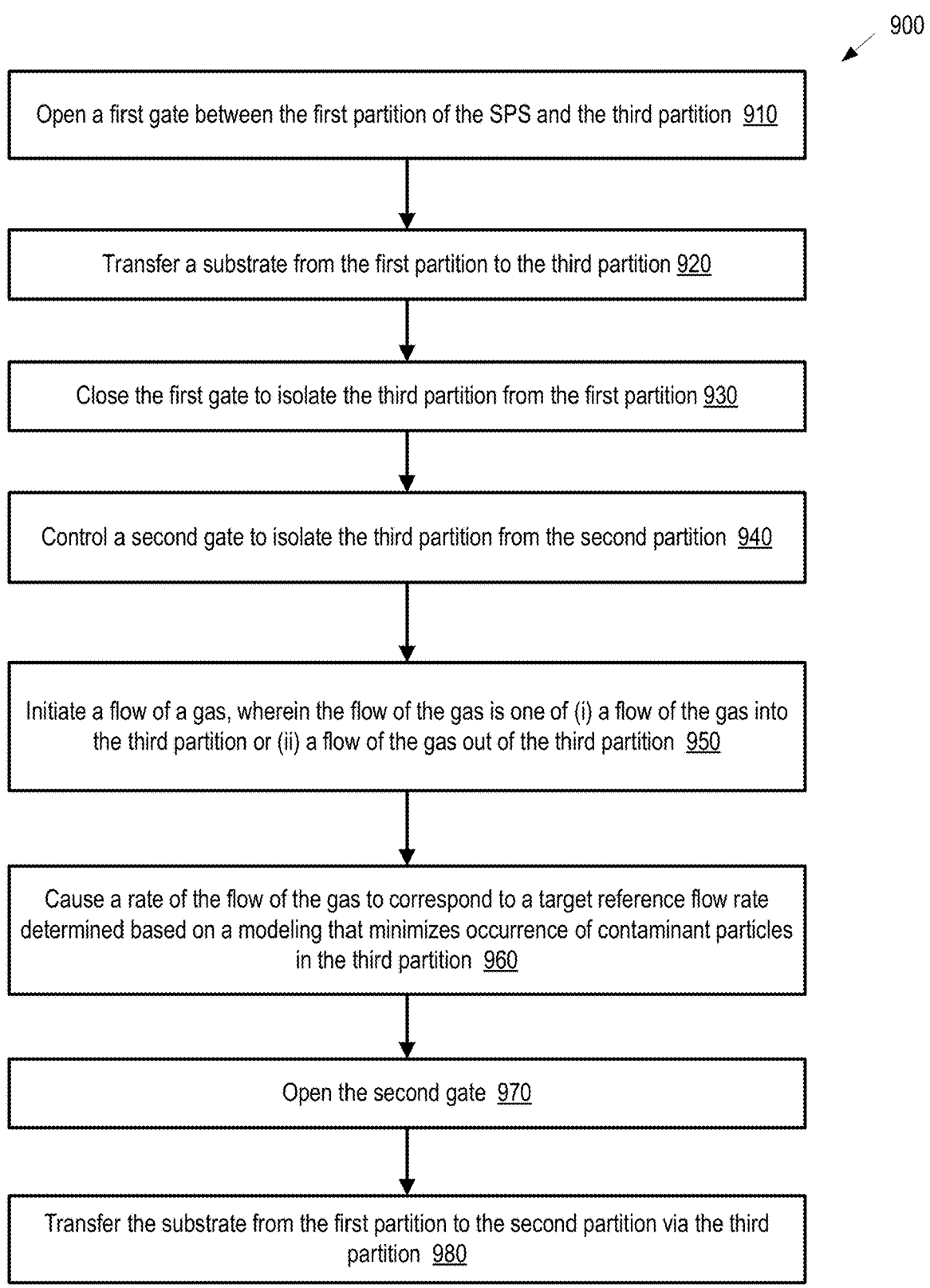
FIG. 9 is a flow diagram of a method of transferring a substrate from a first partition of a substrate processing system to a second partition of the substrate processing system while minimizing exposure of the substrate to contaminants, in accordance with some implementations of the present disclosure.
Figure 10:
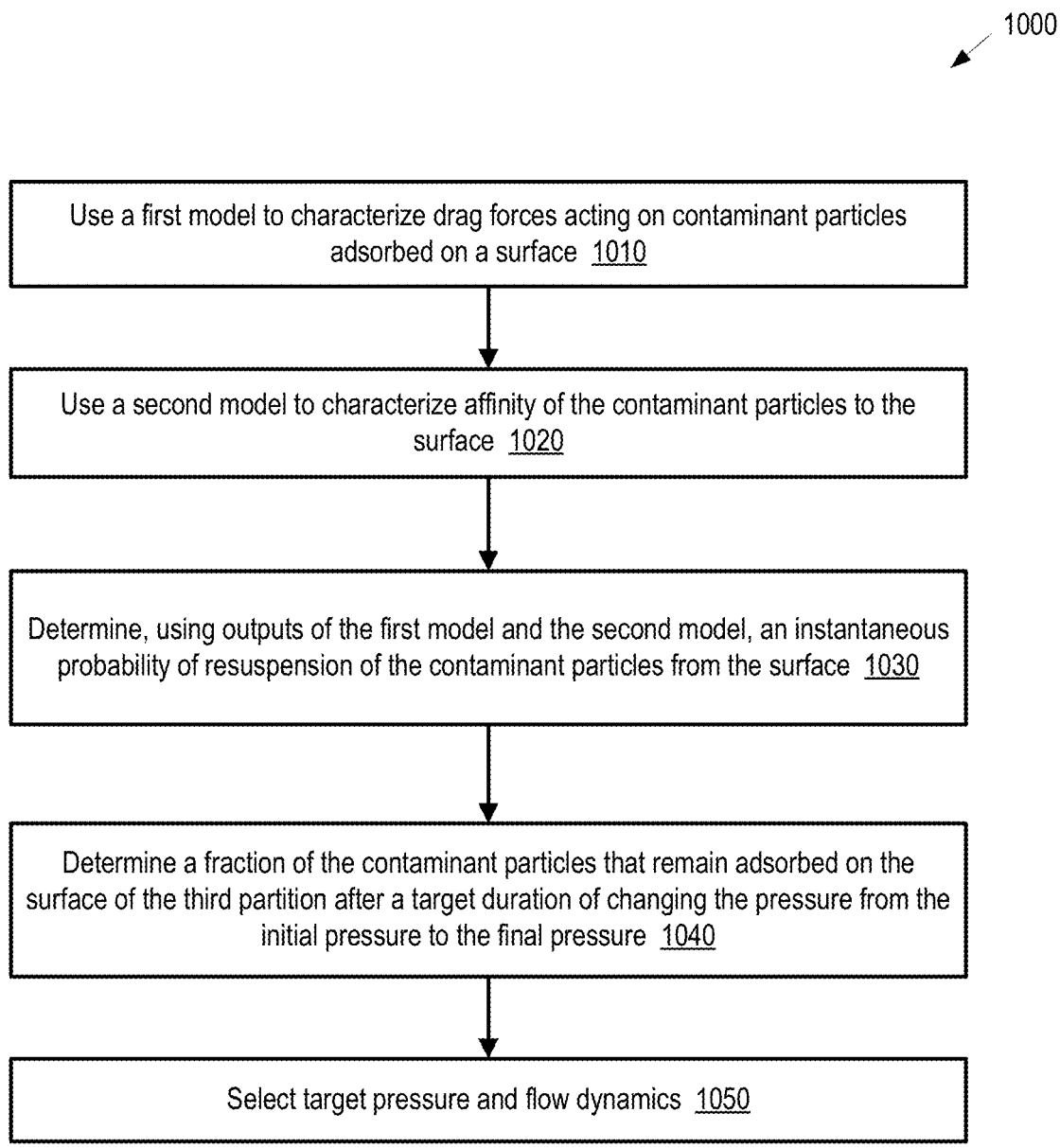
FIG. 10 is a flow diagram of a method of modeling pressure and flow rate dynamics that minimizes occurrence of contaminants in substrate processing systems, in accordance with some implementations of the present disclosure.

FIGS. 8-10 are flow diagrams of methods 800, 900, and 1000, respectively, implementing efficient contamination prevention during pressure changes in substrate processing systems. In some implementations, methods 800, 900, and 1000 are performed using systems and components shown in FIGS. 1, 2, and 7 or any combination thereof. In some implementations, methods 800, 900, and 1000 are performed by computing device 210 of FIG. 2 or controller 720 of FIG. 7A and FIG. 7B. Methods 800, 900, and 1000 can be performed by one or more processing units (e.g., CPUs and/or GPUs), which include (or communicate with) one or more memory devices. In some embodiments, methods 800, 900, and 1000 are performed by multiple processing threads (e.g., CPU threads and/or GPU threads), each thread executing one or more individual functions, routines, subroutines, or operations of the method. In some embodiments, processing threads implementing methods 800, 900, and 1000 are synchronized (e.g., using semaphores, critical sections, and/or other thread synchronization mechanisms). Alternatively, processing threads implementing methods 800, 900, and 1000 re executed asynchronously with respect to each other. Various operations of methods 800, 900, and 1000 are performed in a different order compared with the order shown in FIGS. 8-10. Some operations of the methods can be performed concurrently with other operations. In some embodiments, one or more operations shown in FIGS. 8-10 are not always performed.

FIG. 8 is a flow diagram of a method 800 of enacting pressure changes that minimize occurrence of contaminants in substrate processing systems, in accordance with some implementations of the present disclosure. In some implementations, method 800 enacts pressure changes in a load-lock chamber (LLC) of a substrate processing system (SPS), though it should be understood that method 800 (as well as methods 900 and 1000 described below) can also be used in conjunction with pressure changes in any other sealable chamber or partition of the SPS.

At block 810, method 800 includes sealing the chamber (herein referred to as a first chamber) from an outside environment, which can include any other chamber (e.g., a second chamber) or partition of the SPS adjacent or otherwise coupled to the first chamber. For example, a gate separating the first chamber from the second chamber can be configured to selectively seal and unseal the first chamber from the second chamber. The gate may be communicatively coupled to a controller that causes the gate to selectively seal and unseal the first chamber.

At block 820, method 800 can include a processing device continuously regulating (e.g., using systems and components depicted in FIG. 7A and FIG. 7B) a flow of gas into the first chamber over a target time period. The target time period can be set up by a user/operator of the SPS, and/or specified by a technological process being carried out using the SPS. Regulation of the flow of gas can be facilitated by a valve (herein referred to as a first valve) configured to continuously regulate a flow of gas into the first chamber. The first valve can also be communicatively coupled to the controller (e.g., directly or via intermediate electronic circuits, which can include a power element and other electronic circuits). In some implementations, the first valve is a proportional valve or some other valve that continuously regulates the flow of gas there through, e.g., in response to a continuous control signal input into the first valve. In one non-limiting example, the first valve comprises a coil (a solenoid). An input signal (herein referred to as a first input signal) is configured to cause the coil to produce a continuously varying magnetic field over the target time period.

In some implementations, a system performing method 800 further include a second valve that is configured to regulate an internal state of the first valve, e.g., an orifice of the first valve. The second valve can be used for additional tunability of the first valve. More specifically, the controller causes the second valve to receive a second input signal configured to cause the second valve to regulate the orifice of the first valve. In some implementations, the first input signal and the second input signal are concurrently received by the respective valves.

In some implementations, e.g., in the instances of a pump-up process, the flow of gas into the first chamber, as regulated by the first valve, is set to increase from a relatively small value to a higher target flow after a pressure inside the first chamber has exceeded a target pressure. The target pressure, e.g., 20-25 Torr, can depend on the volume and shape of the first chamber. The target pressure can be determined using empirical testing or simulations, or both, and can be based on the observation that the rate of resuspension of adsorbed particles drops after the pressure has increased above a certain value.

At block 830, method 800 includes causing a pressure in the first chamber to follow a temporal curve (e.g., P(t)) or a temporal sequence of target pressure values (e.g., $P_j$) determined to minimize occurrence of one or more contaminants within the first chamber of the SPS. In some implementations, to monitor how closely the actual pressure in the first chamber (e.g., $P_{LL}(t)$) follows the temporal curve (or the temporal sequence of target pressure values), system performing method 800 further includes a pressure sensor that continuously detects pressure inside the first chamber and communicates the detected pressure to the controller. Having received the detected pressure, the controller causes the first input signal to be adjusted in view of the communicated pressure. Additionally, the system performing method 800 can include a gauge that continuously detects a state of the first valve and communicates the detected state of the first valve to the controller. Having received the detected state, the controller causes the first input signal to be adjusted in view of the communicated state of the first valve. The adjustment of the first input signal causes the pressure inside the first chamber of the SPS to follow the temporal curve (or the temporal sequence of target pressure values) determined to minimize occurrence of one or more contaminants within the first chamber.

In some implementations, the temporal sequence of target pressure values is determined to reduce a degree of resuspension of particles in the first chamber of the SPS during the first time period. For example, the first time period can be a duration of a pump-up process. In some implementations, in addition to a pump-up process, method 800 is also used during a pump-down process. For example, during a second time period the controller causes the first valve to receive a second input signal. The second input signal may be configured to cause the first valve to continuously regulate the flow of gas out of the first chamber of the SPS over the second time period. More specifically, the second input signal may be configured to cause the pressure inside the first chamber to follow another temporal curve (or another temporal sequence of target pressure values) determined to reduce condensation (aerosolization) in the first chamber of the SPS during the second time period.

FIG. 9 is a flow diagram of a method 900 of transferring a substrate from a first partition of a SPS to a second partition of the SPS while minimizing exposure of the substrate to contaminants, in accordance with some implementations of the present disclosure. A term "partition" refers to any chamber of a SPS or any other part or component of the SPS that can be isolated from other parts or components of the SPS. The transfer of the substrate can be performed via an intermediate third partition, e.g., a load-lock chamber, an airlock chamber, a transfer chamber, and the like). At block 910, method 900 includes opening a first gate between the first partition and the third partition, e.g., between a transfer chamber and a load-lock chamber. At block 920, method 900 continues with transferring the substrate from the first partition to the third partition. With the substrate in the third partition, at block 930, the first gate is closed to isolate the third partition from the first partition and, at block 940, the second gate is controlled to isolate the third partition from the second partition. All or some of the blocks 910-940 can be performed based on instructions from a processing device that implements method 900. At block 950, method 900 includes the processing device initiating a flow of a gas. In instances of a pump-up process, the flow of the gas is into the third partition, while in instances of a pump-down process, the flow of the gas is out of the third partition.

At block 960, method 900 continues with the processing device causing a rate of the flow of the gas to have, at each of a plurality of times, a respective target reference flow rate (RFR) of a plurality of RFRs. The plurality of RFRs can be determined based on a modeling that minimizes occurrence, caused by the flow of the gas, of contaminant particles in the third partition. Because of the flow of the gas, the pressure in the third partition changes from an initial pressure to a final pressure. In one non-limiting example, during a pump-up process, the initial pressure is below 10 Torr and the final pressure is above 700 Torr. Similarly, during a pump-down process, the initial pressure is above 700 Torr and the final pressure is below 10 Torr.

Method 900 may then continue with the processing device, responsive to a pressure in the third partition changing from the initial pressure to the final pressure, opening the second gate (block 970) and transferring the substrate from the third partition to the second partition (block 980).

FIG. 10 is a flow diagram of a method 1000 of modeling pressure and flow rate dynamics that minimizes occurrence of contaminants in substrate processing systems, in accordance with some implementations of the present disclosure. Method 1000 may be implemented by a computing device 210 of FIG. 3 or any other computing device. Method 1000 may be implemented in conjunction with method 800 of FIG. 8 and/or method 900 of FIG. 9. In some implementations, method 1000 may be performed in real time, concurrently with method 800 and/or method 900. In some implementations, method 1000 may be performed prior to method 800 and/or method 900 with output of method 1000 (e.g., a target pressure and flow rate dynamics) stored and used subsequently, during performance of method 800 and/or method 900.

In some implementations, method 1000 determines a target pressure P(t) and a target flow rate F(t) for a pump-up stage of operations of a load-lock chamber or any other partition of a substrate processing system. At block 1010, method 1000 includes using a first model to characterize drag forces acting on contaminant particles adsorbed on a surface of a chamber (e.g., the third partition of method 900). In some implementations, an input into the first model includes a viscosity of the gas (e.g., kinematic viscosity), a velocity of the gas near the surface of the partition, and various other parameters, such as parameters characterizing geometry (e.g., volume, area, and shape) of the chamber, density of the gas, temperature of the gas, type of the gas (e.g., monoatomic, diatomic, etc.), and the like. In some implementations, the velocity of the gas near the surface of the chamber is determined based on the rate of the flow of the gas into the chamber.

At block 1020, method 1000 continues with using a second model to characterize affinity of the contaminant particles to the surface of the chamber. In some implementations, the second model determines a threshold force for detachment of the contaminant particles from the surface of the chamber. The threshold force can depend on a radius of the contaminant particles, which is used an input into the second model. Other inputs can include a strength of attraction (e.g., Van der Waals interaction) between the contaminant particles and the surface of the chamber. For example, the strength of attraction may be parameterized using an adhesion energy that depends on the type of the material of the contaminant particles, the radius (or some other dimensions) of the contaminant particles, roughness of the surface of the chamber, and so on.

At block 1030, method 1000 continues with determining, using outputs of the first model and the second model, an instantaneous probability of resuspension of the contaminant particles from the surface of the third partition. The instantaneous resuspension probability refers to a probability of resuspension of contaminant particles (e.g., particles of a particular size) from the surface assuming particular instantaneous values of the pressure and temperature of the gas and the flow rate of the gas into the chamber. As the instantaneous values change (e.g., over the duration of the pump-up process), the instantiations probability of resuspension changes as well.

At block 1040, method 1000 continues with determining a fraction of the contaminant particles that remain adsorbed on the surface of the chamber after a target duration of changing the pressure from the initial pressure to the final pressure. Operations of block 1040 can use the instantaneous probability (determined during operation of block 1030) as an input and can further use a prospective flow rate $F_1(t)$ (as well as the ensuing dynamics $P_1(t)$ of the pressure in the chamber) as an additional input. Various other prospective flow rates $F_2(t)$, $F_3(t)$, . . . (as well as respective pressure dynamics $P_2(t)$, $P_3(t)$, . . . ) can be used as other inputs. Different input flow rates can correspond to different durations of the pump-up process. Some of the processes can be relatively short (and thus have relatively high maximum flow rates) while some processes can be longer (having correspondingly lower maximum flow rates). For each of the inputs, a processing device implementing method 1000 can compute the fraction of contaminant particles remaining on the surface. For example, shorter and, therefore, more aggressive pump-up processes may have a smaller fraction of the particles that remain adsorbed on the surface.

At block 1050, method 1000 continues with the processing device selecting target dynamics of the flow rate F(t) (and pressure P(t)) from a variety of possible input dynamics. In some implementations, a continuous curve F(t) (and a respective curve P(t)) can be selected. In other implementations, a discrete plurality of target flow rates $F(t_1)$, $F(t_2)$, . . . (reference flow rates) can be selected. The selected (continuous or discrete) flow rate F(t) (and pressure P(t)) can be stored for use in subsequent pump-down processes (e.g., as described in relation to methods 800 and 900 above). The (continuous or discrete) target flow rates are, therefore, determined based on (i) a target duration of changing the pressure in the chamber from the initial pressure to the final pressure, and (ii) a target fraction of contaminant particles that are to remain adsorbed on the surface of the chamber. The target fraction can depend on specifics of a particular technological process being implemented and on corresponding demands to the quality of the product (e.g., wafer) yield.

Figure 11:
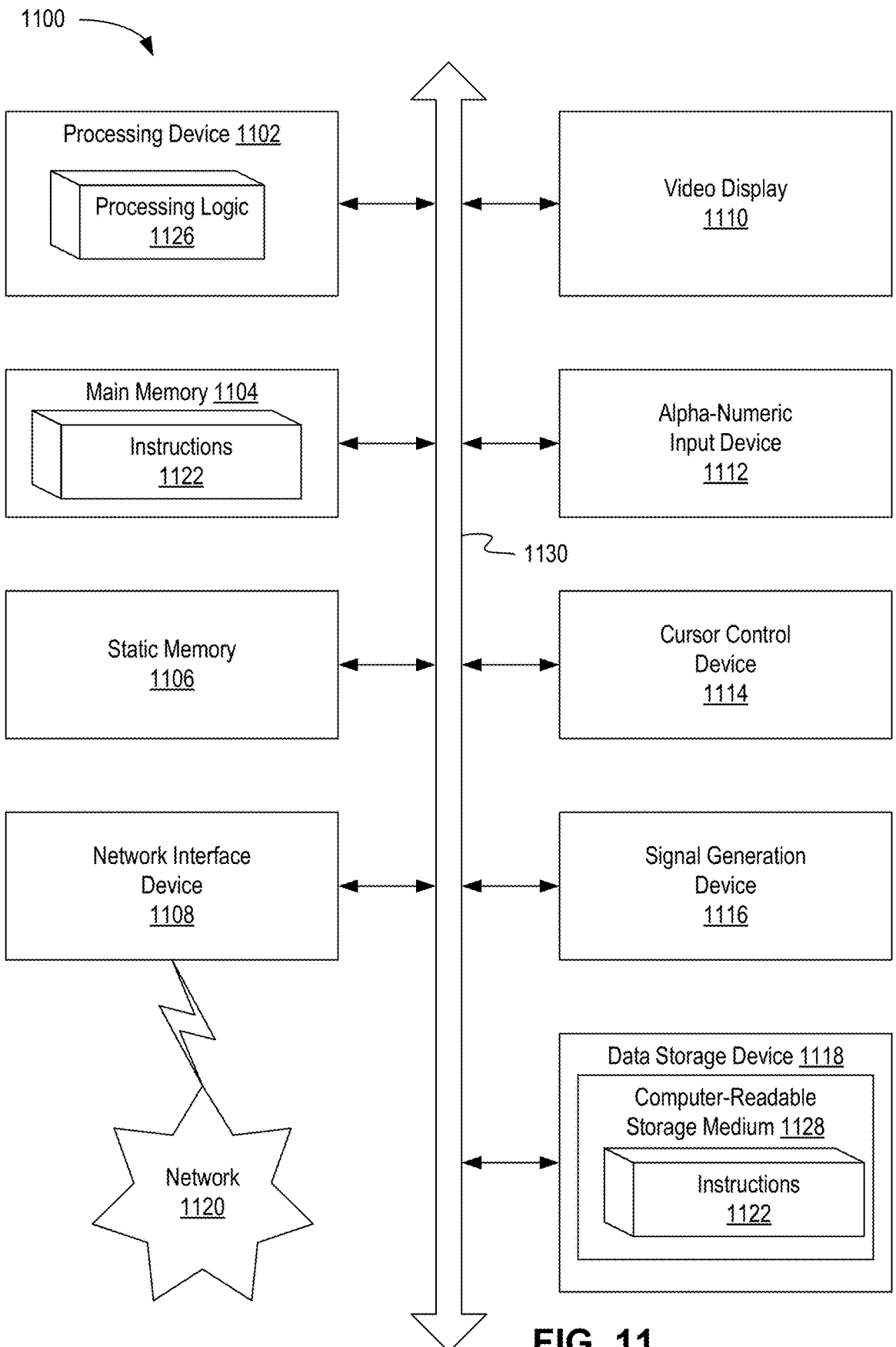
FIG. 11 depicts a block diagram of an example processing device operating in accordance with one or more aspects of the present disclosure.

FIG. 11 depicts a block diagram of an example computing device 1100 operating in accordance with one or more aspects of the present disclosure. Computing device 1100 may be the computing device 210 of FIG. 2 or controller 720 of FIG. 7A and FIG. 7B or any other processing device or a combination of processing devices that perform method 800 of enacting pressure changes to minimize occurrence of contaminants in manufacturing systems, method 900 of transferring a substrate from a first partition to a second partition of the SPS, and/or method 1000 of modeling pressure and flow rate dynamics that minimizes occurrence of contaminants in substrate processing systems.

Example computing device 1100 may be connected to other processing devices in a LAN, an intranet, an extranet, and/or the Internet. The computing device 1100 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein.

Example computing device 1100 may include a processing device 1102 (e.g., a CPU), a main memory 1104 (e.g., read-only memory (ROM), flash memory, dynamic random access memory (DRAM) such as synchronous DRAM (SDRAM), etc.), a static memory 1106 (e.g., flash memory, static random access memory (SRAM), etc.), and a secondary memory (e.g., a data storage device 1118), which may communicate with each other via a bus 1130.

Processing device 1102 represents one or more general-purpose processing devices such as a microprocessor, central processing unit, or the like. More particularly, processing device 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 1102 may include processing logic 1126 may be configured to execute instructions implementing method 800 of enacting pressure changes to minimize occurrence of contaminants in manufacturing systems, method 900 of transferring a substrate from a first partition to a second partition of the SPS, and/or method 1000 of modeling pressure and flow rate dynamics that minimizes occurrence of contaminants in substrate processing systems.

Example computing device 1100 may further comprise a network interface device 1108, which may be communicatively coupled to a network 1120. Example computing device 1100 may further comprise a video display 1110 (e.g., a liquid crystal display (LCD), a touch screen, or a cathode ray tube (CRT)), an alphanumeric input device 1112 (e.g., a keyboard), an input control device 1114 (e.g., a cursor control device, a touch-screen control device, a mouse), and a signal generation device 1116 (e.g., an acoustic speaker).

Data storage device 1118 may include a computer-readable storage medium (or, more specifically, a non-transitory computer-readable storage medium) 1128 on which is stored one or more sets of executable instructions 1122. In accordance with one or more aspects of the present disclosure, executable instructions 1122 may comprise executable instructions implementing method 800 of enacting pressure changes to minimize occurrence of contaminants in manufacturing systems, method 900 of transferring a substrate from a first partition to a second partition of the SPS, and/or method 1000 of modeling pressure and flow rate dynamics that minimizes occurrence of contaminants in substrate processing systems.

Executable instructions 1122 may also reside, completely or at least partially, within main memory 1104 and/or within processing device 1102 during execution thereof by example computing device 1100, main memory 1104 and processing device 1102 also constituting computer-readable storage media. Executable instructions 1122 may further be transmitted or received over a network via network interface device 1108.

While the computer-readable storage medium 1128 is shown in FIG. 11 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

The following examples illustrate further implementations in accordance with the instant disclosure.

In example 1, a system that includes: a load-lock chamber (LLC) of a substrate processing system, the LLC including one or more valves regulating a flow of gas directed into the LLC or out of the LLC; and a controller configured to: with the LLC sealed from an outside environment, initiate the flow of gas through the one or more valves; and cause a rate of the flow of gas to correspond, at each of a plurality of times, to a respective reference flow rate (RFR) of a plurality of RFRs, wherein the plurality of RFRs include at least three RFRs and are determined to minimize occurrence of one or more contaminants within an environment of the LLC.

In example 2, the system of example 1, wherein the plurality of RFRs are determined in view of an initial pressure, a final pressure, and a target duration of a transition of the environment of the LLC from the initial pressure to the final pressure.

In example 3, the system of example 1, wherein the one or more contaminants appear in the environment of the LLC during a transition of the environment of the LLC from an initial pressure to a final pressure.

In example 4, the system of example 3, further including: a pressure sensor communicatively coupled to the controller, wherein the controller is further to: receive, from the pressure sensor, a current pressure reading; obtain a difference of the received current pressure reading and a respective reference pressure value of a plurality of reference pressure values, the respective reference pressure value associated with a current instance of time; and adjust the rate of the flow of gas through the one or more valves to mitigate the obtained difference.

In example 5, the system of example 1, wherein the one or more valves are configured to continuously regulate the flow of gas.

In example 6, the system of example 1, wherein the flow of gas is directed into the LLC, and wherein the plurality of RFRs are selected to minimize resuspension, within the environment of the LLC, of a particulate matter from an inner surface of the LLC.

In example 7, the system of example 1, wherein the flow of gas is directed out of the LLC, and wherein the plurality of RFRs are selected to prevent aerosol formation within the environment of the LLC.

In example 8, a system including: a substrate processing system (SPS) including a first chamber and a second chamber; a first gate configured to selectively seal and unseal the first chamber of the SPS from the second chamber of the SPS; a first valve configured to continuously regulate a flow of gas into the first chamber of the SPS; and a controller communicatively coupled to the first gate and the first valve, the controller configured to: cause the first gate to seal the first chamber of the SPS from the second chamber of the SPS; and cause the first valve to receive a first input signal, wherein the first input signal is configured to cause the first valve to continuously regulate the flow of gas into the first chamber of the SPS over a first time period.

In example 9, the system of example 8, wherein the first input signal is configured to cause a pressure inside the first chamber of the SPS to follow a temporal sequence of target pressure values.

In example 10, the system of example 9, wherein the temporal sequence of the target pressure values is determined to reduce a degree of resuspension of particles in the first chamber of the SPS during the first time period.

In example 11, the system of example 8, wherein the controller is further to cause the first valve to receive a second input signal, wherein the second input signal is configured to cause the first valve to continuously regulate the flow of gas out of the first chamber of the SPS over a second time period.

In example 12, the system of example 11, wherein the second input signal is configured to cause a pressure inside the first chamber of the SPS to follow a temporal sequence of target pressure values, wherein the temporal sequence of the target pressure values is determined to reduce condensation in the first chamber of the SPS during the second time period.

In example 13, the system of example 8, wherein the first valve is a proportional valve.

In example 14, the system of example 13, wherein the first valve includes a coil, and wherein the first input signal is configured to cause the coil to produce a continuously varying magnetic field over the first time period.

In example 15, the system of example 8, further including a second valve configured to regulate an orifice of the first valve, wherein the controller is further configured to cause the second valve to receive a second input signal, wherein the second input signal is configured to cause the second valve to regulate the orifice of the first valve.

In example 16, the system of example 8, wherein the flow of gas into the first chamber of the SPS over the first time period is to increase to a target flow after a pressure inside the first chamber of the SPS has exceeded a target pressure.

In example 17, the system of example 8, further including a pressure sensor that continuously detects pressure inside the first chamber of the SPS and communicates the detected pressure to the controller, wherein the controller is configured to cause the first input signal to be adjusted in view of the communicated pressure.

In example 18, the system of example 17, wherein the first input signal is adjusted to cause the pressure inside the first chamber of the SPS to follow a temporal curve determined to minimize occurrence of one or more contaminants within the first chamber of the SPS.

In example 19, the system of example 8, wherein the first valve includes a gauge that continuously detects a state of the first valve and communicates the detected state of the first valve to the controller, wherein the controller is configured to cause the first input signal to be adjusted in view of the communicated state of the first valve.

In example 20, the system of example 8, wherein the SPS further includes: a second gate configured to selectively seal and unseal the first chamber of the SPS from a third chamber of the SPS; and a second valve configured to continuously regulate a flow of gas out of the first chamber of the SPS; wherein the controller is communicatively coupled to the second gate and the second valve and further configured to: cause the second gate to seal the first chamber of the SPS from the third chamber of the SPS; and cause the second valve to receive a first input signal, wherein the first input signal is configured to cause the second valve to continuously regulate the flow of gas out of the first chamber of the SPS over a second time period.

In example 21, a method including: sealing a chamber of a substrate processing system (SPS) from an outside environment; continuously regulating a flow of gas into the chamber of or out of the chamber over a target time period; and causing a pressure in the chamber of the SPS to follow a temporal curve determined to minimize occurrence of one or more contaminants within the chamber of the SPS.

In example 22, a method to transfer a substrate from a first partition of a substrate processing system (SPS) to a second partition of the SPS, the method including: opening a first gate between the first partition and a third partition of the SPS; transferring the substrate from the first partition to the third partition; closing the first gate to isolate the third partition from the first partition; controlling a second gate to isolate the third partition from the second partition; initiating a flow of a gas, wherein the flow of the gas is one of (i) a flow of the gas into the third partition or (ii) a flow of the gas out of the third partition; causing a rate of the flow of the gas to have, at each of a plurality of times, a respective target reference flow rate (RFR) of a plurality of RFRs, wherein the plurality of RFRs are determined based on a modeling that minimizes occurrence, caused by the flow of the gas, of contaminant particles in the third partition; and responsive to a pressure in the third partition changing from an initial pressure to a final pressure, opening the second gate, and transferring the substrate from the third partition to the second partition.

In example 23, the method of example 22, wherein the flow of the gas is into the third partition, and wherein the modeling includes a first model that characterizes drag forces acting on contaminant particles adsorbed on a surface of the third partition.

In example 24, the method of example 23, wherein an input into the first model includes: a viscosity of the gas; and a velocity of the gas near the surface of the third partition, the velocity of the gas determined based on the rate of the flow of the gas into the third partition.

In example 25, the method of example 23, wherein the modeling includes a second model that characterizes affinity of the contaminant particles to the surface of the third partition.

In example 26, the method of example 25, wherein the modeling includes: determining, using outputs of the first model and the second model, an instantaneous probability of resuspension of the contaminant particles from the surface of the third partition.

In example 27, the method of example 23, wherein the modeling includes: determining a fraction of the contaminant particles that remain adsorbed on the surface of the third partition after a target duration of changing the pressure in the third partition from the initial pressure to the final pressure.

In example 28, the method of example 23, wherein the plurality of RFRs are further determined based on (i) a target duration of changing the pressure in the third partition from the initial pressure to the final pressure, and (ii) a target fraction of contaminant particles that are to remain adsorbed on the surface of the third partition.

In example 29, the method of example 22, wherein the initial pressure is one of a first pressure below 10 Torr or a second pressure above 700 Torr, and wherein the final pressure is another one of the first pressure below 10 Torr or the second pressure above 700 Torr.

In example 30, the method of example 22, wherein the flow of the gas is out of the third partition and the contaminant particles are water particles.

In example 31, the method of example 30, wherein the modeling includes determining, at each of the plurality of times, a respective threshold pressure of a plurality of threshold pressures associated with condensation of the water particles.

In example 32, the method of example 31, wherein each of the respective target RFRs is at or below the respective threshold pressure.

In example 33, a system including: a substrate processing system including a first partition, a second partition, and a third partition; a first gate configured to isolate the third partition from the first partition; a second gate configured to isolate the third partition from the second partition; a valve configured to regulate a flow of a gas to the third partition, wherein the flow of the gas is one of (i) a flow of the gas into the third partition or (ii) a flow of the gas out of the third partition; and a controller configured to: initiate a flow of a gas, wherein the flow of the gas is one of (i) a flow of the gas into the third partition or (ii) a flow of the gas out of the third partition; cause a rate of the flow of the gas to have, at each of a plurality of times, a respective target reference flow rate (RFR) of a plurality of RFRs, wherein the plurality of RFRs are determined based on a modeling that minimizes occurrence, caused by the flow of the gas, of contaminant particles in the third partition; and responsive to a pressure in the third partition changing from an initial pressure to a final pressure, cause: the first gate and the second gate to be opened; and a substrate to be transferred from the first partition to the second partition via the third partition.

In example 34, the system of example 33, wherein the flow of the gas is into the third partition and the modeling includes a first model that characterizes drag forces acting on contaminant particles adsorbed on a surface of the third partition.

In example 35, the system of example 34, wherein the modeling includes a second model that characterizes affinity of the contaminant particles to the surface of the third partition.

In example 36, the system of example 33, wherein the flow of the gas is out of the third partition and the contaminant particles are water particles, and wherein the modeling includes determining, at each of the plurality of times, a respective threshold pressure of a plurality of threshold pressures associated with condensation of the water particles.

In example 37, the system of example 36, wherein each of the respective target RFRs is at or below the respective threshold pressure.

In example 38, a non-transitory computer-readable memory storing instruction that, when executed by a processing device, cause the processing device to: cause a first gate to isolate a first partition of a substrate processing system (SPS) from a second partition of the SPS; cause a second gate to isolate a third partition of the SPS from the second partition; initiate a flow of a gas, wherein the flow of the gas is one of (i) a flow of the gas into the second partition or (ii) a flow of the gas out of the second partition; cause a rate of the flow of the gas to have, at each of a plurality of times, a respective target reference flow rate (RFR) of a plurality of RFRs, wherein the plurality of RFRs are determined based on a modeling that minimizes occurrence, caused by the flow of the gas, of contaminant particles in the second partition; and responsive to a pressure in the third partition changing from an initial pressure to a final pressure: cause the first gate and the second gate to be opened; and cause a substrate to be transferred from the first partition to the third partition via the second partition.

In example 39, the non-transitory computer-readable memory of example 38, wherein the flow of the gas is into the second partition, and wherein the modeling includes: a first model that characterizes drag forces acting on contaminant particles adsorbed on a surface of the second partition; and a second model that characterizes affinity of the contaminant particles to the surface of the second partition.

In example 40, the non-transitory computer-readable memory of example 38, wherein the flow of the gas is out of the second partition and the contaminant particles are water particles, and wherein the modeling includes determining, at each of the plurality of times, a respective threshold pressure of a plurality of threshold pressures associated with condensation of the water particles.

It should be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The implementations of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one implementation" or "an implementation" means that a particular feature, structure, or characteristic described in connection with the implementation is included in at least one implementation of the disclosure. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

In the foregoing specification, a detailed description has been given with reference to specific exemplary implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation, implementation, and/or other exemplarily language does not necessarily refer to the same implementation or the same example, but may refer to different and distinct implementations, as well as potentially the same implementation.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such. Also, the terms "first," "second," "third," "fourth," etc. as used herein are meant as labels to distinguish among different elements and may not necessarily have an ordinal meaning according to their numerical designation.

What is claimed is:

1. A system comprising:
    a load-lock chamber (LLC) of a substrate processing system, the LLC comprising one or more valves regulating a flow of gas directed into the LLC or out of the LLC; and
    a controller configured to:
        with the LLC sealed from an outside environment, initiate the flow of gas through the one or more valves; and
        cause a rate of the flow of gas to correspond, at each of a plurality of times, to a respective reference flow rate (RFR) of a plurality of RFRs, wherein the plurality of RFRs comprises a first set of two or more increasing RFRs and a second set of one or more RFRs that are at least twice larger than a maximum RFR of the first set of two or more RFRs, a transition from the first set to the second set occurring at a pressure in the LLC associated with a target reduction of occurrence of one or more contaminants within an environment of the LLC.

2. The system of claim 1, wherein the plurality of RFRs are determined in view of an initial pressure, a final pressure, and a target duration of a transition of the environment of the LLC from the initial pressure to the final pressure.

3. The system of claim 1, wherein the one or more contaminants appear in the environment of the LLC during a transition of the environment of the LLC from an initial pressure to a final pressure.

4. The system of claim 3 further comprising:
    a pressure sensor communicatively coupled to the controller, wherein the controller is further to:
    receive, from the pressure sensor, a current pressure reading;
    obtain a difference of the received current pressure reading and a respective reference pressure value of a plurality of reference pressure values, the respective reference pressure value associated with a current instance of time; and
    adjust the rate of the flow of gas through the one or more valves to mitigate the obtained difference.

5. The system of claim 1, wherein the one or more valves are configured to continuously regulate the flow of gas.

6. The system of claim 1, wherein the flow of gas is directed into the LLC, and wherein the plurality of RFRs are selected to minimize resuspension, within the environment of the LLC, of a particulate matter from an inner surface of the LLC.

7. The system of claim 1, wherein the controller is further to:
    cause the rate of the flow of gas directed out of the LLC to correspond, at each of a second plurality of times, to a second plurality of RFRs, and wherein the second plurality of RFRs are selected to prevent aerosol formation within the environment of the LLC.

8. A system comprising:
    a substrate processing system (SPS) comprising a first chamber and a second chamber;
    a first gate configured to selectively seal and unseal the first chamber of the SPS from the second chamber of the SPS;
    a first valve configured to continuously regulate a flow of gas into the first chamber of the SPS; and
    a controller communicatively coupled to the first gate and the first valve, the controller configured to:
        cause the first gate to seal the first chamber of the SPS from the second chamber of the SPS; and
        cause the first valve to receive a first input signal, wherein the first input signal is configured to cause the first valve to continuously regulate the flow of gas into the first chamber of the SPS over a first time period causing a pressure inside the first chamber of the SPS to follow a temporal sequence of target pressure values.

9. The system of claim 8, wherein the temporal sequence of the target pressure values is determined to reduce a degree of resuspension of particles in the first chamber of the SPS during the first time period.

10. The system of claim 8, wherein the controller is further to cause the first valve to receive a second input signal, wherein the second input signal is configured to cause the first valve to continuously regulate the flow of gas out of the first chamber of the SPS over a second time period.

11. The system of claim 10, wherein the second input signal is configured to cause a pressure inside the first chamber of the SPS to follow a temporal sequence of target pressure values,
wherein the temporal sequence of the target pressure values is determined to reduce condensation in the first chamber of the SPS during the second time period.

12. The system of claim 8, wherein the first valve is a proportional valve.

13. The system of claim 12, wherein the first valve comprises a coil, and wherein the first input signal is configured to cause the coil to produce a continuously varying magnetic field over the first time period.

14. The system of claim 8, further comprising a second valve configured to regulate an orifice of the first valve, wherein the controller is further configured to cause the second valve to receive a second input signal, wherein the second input signal is configured to cause the second valve to regulate the orifice of the first valve.

15. The system of claim 8, wherein the flow of gas into the first chamber of the SPS over the first time period is to increase to a target flow after a pressure inside the first chamber of the SPS has exceeded a target pressure.

16. The system of claim 8, further comprising a pressure sensor that continuously detects pressure inside the first chamber of the SPS and communicates the detected pressure to the controller, wherein the controller is configured to cause the first input signal to be adjusted in view of the communicated pressure.

17. The system of claim 16, wherein the first input signal is adjusted to cause the pressure inside the first chamber of the SPS to follow a temporal curve determined to minimize occurrence of one or more contaminants within the first chamber of the SPS.

18. The system of claim 8, wherein the first valve comprises a gauge that continuously detects a state of the first valve and communicates the detected state of the first valve to the controller, wherein the controller is configured to cause the first input signal to be adjusted in view of the communicated state of the first valve.

19. The system of claim 8, wherein the SPS further comprises:
a second gate configured to selectively seal and unseal the first chamber of the SPS from a third chamber of the SPS; and
a second valve configured to continuously regulate a flow of gas out of the first chamber of the SPS;
wherein the controller is communicatively coupled to the second gate and the second valve and further configured to:
cause the second gate to seal the first chamber of the SPS from the third chamber of the SPS; and
cause the second valve to receive a first input signal, wherein the first input signal is configured to cause the second valve to continuously regulate the flow of gas out of the first chamber of the SPS over a second time period.

20. A method to transfer a substrate from a first partition of a substrate processing system (SPS) to a second partition of the SPS, the method comprising;
opening a first gate between the first partition and a third partition of the SPS;
transferring the substrate from the first partition to the third partition;
closing the first gate to isolate the third partition from the first partition;
controlling a second gate to isolate the third partition from the second partition;
initiating a flow of a gas, wherein the flow of the gas is one of (i) a flow of the gas into the third partition or (ii) a flow of the gas out of the third partition;
causing a rate of the flow of the gas to have, at each of a plurality of times, a respective target reference flow rate (RFR) of a plurality of RFRs, wherein the plurality of RFRs are determined based on a modeling that reduces resuspension, caused by the flow of the gas, of contaminant particles adsorbed on a surface of the third partition; and
responsive to a pressure in the third partition changing from an initial pressure to a final pressure, opening the second gate, and transferring the substrate from the third partition to the second partition.

21. The method of claim 20, wherein the flow of the gas is into the third partition, wherein the modeling uses a first model that characterizes drag forces acting on contaminant particles adsorbed on a surface of the third partition, and wherein an input into the first model comprises:
a viscosity of the gas; and
a velocity of the gas near the surface of the third partition, the velocity of the gas determined based on the rate of the flow of the gas into the third partition.

22. The method of claim 21, wherein the modeling uses a second model that characterizes affinity of the contaminant particles to the surface of the third partition, and wherein the modeling comprises:
determining, using outputs of the first model and the second model, an instantaneous probability of resuspension of the contaminant particles from the surface of the third partition; and
determining a fraction of the contaminant particles that remain adsorbed on the surface of the third partition after a target duration of changing the pressure in the third partition from the initial pressure to the final pressure.

23. The method of claim 21, wherein the plurality of RFRs are further determined based on (i) a target duration of changing the pressure in the third partition from the initial pressure to the final pressure, and (ii) a target fraction of contaminant particles that are to remain adsorbed on the surface of the third partition.

* * * * *